(12) United States Patent
Tachibana et al.

(10) Patent No.: US 7,531,397 B2
(45) Date of Patent: May 12, 2009

(54) METHOD FOR MANUFACTURING A SEMICONDUCTOR DEVICE ON GAN SUBSTRATE HAVING SURFACE BIDIRECTIONALLY INCLINED TOWARD <1-100> AND <11-20> DIRECTIONS RELATIVE TO {0001} CRYSTAL PLANES

(75) Inventors: Koichi Tachibana, Kawasaki (JP); Chie Hongo, Yokohama (JP); Shinya Nunoue, Ichikawa (JP); Masaaki Onomura, Setagaya-ku (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/969,079

(22) Filed: Jan. 3, 2008

(65) Prior Publication Data

US 2008/0113497 A1    May 15, 2008

Related U.S. Application Data

(63) Continuation of application No. 11/185,768, filed on Jul. 21, 2005, now Pat. No. 7,339,255.

(30) Foreign Application Priority Data

Aug. 24, 2004   (JP)   ............................. 2004-244072

(51) Int. Cl.
*H01L 21/36* (2006.01)
(52) U.S. Cl. ...................... 438/172; 438/478; 438/481; 257/191; 257/200; 257/615; 257/E33.025; 257/E21.097; 257/E21.126

(58) Field of Classification Search ................. 438/172; 257/200, E33.025, E21.097
See application file for complete search history.

(56) References Cited

U.S. PATENT DOCUMENTS 5,742,628 A    4/1998   Fujii (Continued)

FOREIGN PATENT DOCUMENTS

CN    1347581    5/2002

(Continued)

OTHER PUBLICATIONS

Shuji Nakamura, et al., "Continuous-wave operation of InGaN/GaN/AlGaN-based laser diodes grown on GaN substrates", Applied Physics Letters, vol. 72, No. 16, Apr. 20, 1998, pp. 2014-2016.

*Primary Examiner*—Davienne Monbleau
*Assistant Examiner*—Christopher M Roland
(74) *Attorney, Agent, or Firm*—Oblon, Spivak, McClelland, Maier & Neustadt, P.C.

(57) ABSTRACT

A semiconductor substrate encompasses a GaN substrate and a single-crystal layer formed of III-V nitride compound semiconductor epitaxially grown on the GaN substrate. The GaN substrate has a surface orientation defined by an absolute value of an off-angle of the surface from {0001} plane towards <1-100> direction lying in a range of 0.12 degree to 0.35 degree and by an absolute value of an off-angle of the surface from {0001} plane towards <11-20> direction lying in a range of 0.00 degree to 0.06 degree.

22 Claims, 16 Drawing Sheets

| U.S. PATENT DOCUMENTS | | | | FOREIGN PATENT DOCUMENTS | | |
|---|---|---|---|---|---|---|
| 6,144,045 | A | 11/2000 | Bandic et al. | JP | 11-191657 | 7/1999 |
| 6,420,198 | B1 | 7/2002 | Kimura et al. | JP | 2000-223743 | 8/2000 |
| 6,734,530 | B2 | 5/2004 | Ban | JP | 2003-60318 | 2/2003 |
| 2002/0113249 | A1 | 8/2002 | Hori et al. | JP | 2003-238297 | 8/2003 |
| 2003/0001238 | A1 | 1/2003 | Ban | JP | 2004-327655 | 11/2004 |

US 7,531,397 B2

METHOD FOR MANUFACTURING A SEMICONDUCTOR DEVICE ON GAN SUBSTRATE HAVING SURFACE BIDIRECTIONALLY INCLINED TOWARD <1-100> AND <11-20> DIRECTIONS RELATIVE TO {0001} CRYSTAL PLANES

CROSS REFERENCE TO RELATED APPLICATIONS AND INCORPORATION BY REFERENCE

This application is a continuation of U.S. patent application Ser. No. 11/185,768, now U.S. Pat. No. 7,339,255, filed Jul. 21, 2005 and claims benefit of priority under 35 USC 119 based on Japanese Patent Application No. P2004-244072 filed Aug. 24, 2004, the entire contents of which are incorporated by reference herein.

BACKGROUND OF THE INVENTION

1. Field of the Invention

The present invention relates to a semiconductor substrate, or an epitaxial substrate, which includes a bulk GaN substrate and an epitaxially grown layer on the bulk GaN substrate, and semiconductor devices implemented by an epitaxial growth on the semiconductor substrate. Here, the semiconductor devices include various semiconductor optical devices such as semiconductor light-emitting devices and various semiconductor electric devices such as transistors.

2. Description of the Related Art

III-V nitride compound semiconductors such as gallium nitride (GaN) have a wide bandgap. Utilizing properties and features of the wide bandgap semiconductors, high-brightness ultraviolet-blue/green light-emitting diodes (LEDs) and blue-violet laser diodes and the like have been studied and developed. Moreover, high frequency/high power III-V nitride compound semiconductor field-effect transistors (FETs) or the like have been fabricated based upon the properties and features of the wide bandgap semiconductors.

Since there were no substrates that allow lattice matching in crystal growth of III-V nitride compound semiconductors in the early stages of research and development, semiconductors devices were fabricated through crystal growth using sapphire ($Al_2O_3$), silicon carbide (SiC) or the like as a substrate. A two-stage growth method is used for crystal growth of a III-V nitride compound semiconductor using an $Al_2O_3$ substrate. With such a method, however, attributing to differences in lattice constant and thermal expansion coefficient between the $Al_2O_3$ and the III-V nitride compound semiconductor, a great number of threading dislocations and defects are generated. These threading dislocations and defects are major problems during practical use in that they bring about a shortened laser diode lifetime, for example, poor reliability.

Therefore, provision of bulk GaN substrates, on which homoepitaxial growth can be achieved, to a market has been a long-awaited desire. Due to recent advances in crystal growth technology, bulk GaN substrates have become available, and results of fabricating a prototype of an InGaN/GaN/AlGaN-based laser diode have been reported (see S. Nakamura, et al. Continuous-wave operation of InGaN/GaN/AlGaN-based laser diodes grown on GaN substrates, Applied Physics Letters, Vol. 72, No. 2, pp. 2014-2016, 20 Apr., 1998).

However, there is little knowledge regarding the bulk GaN substrate itself or homoepitaxial growth on the bulk GaN substrate, and a method for manufacturing a semiconductor device such as a high-performance semiconductor optical device or a high-performance semiconductor electronic device using a III-V nitride compound semiconductor is yet to be established.

SUMMARY OF THE INVENTION

In view of these situations, it is an object of the present invention to provide a semiconductor substrate or an epitaxial substrate, which encompasses a bulk GaN substrate (hereinafter called "GaN substrate"), and an epitaxially grown layer on the GaN substrate, the epitaxially grown layer having an improved surface flatness required for dimensions of a semiconductor device, a semiconductor device with high performance implemented by an epitaxial growth on the semiconductor substrate (epitaxial substrate).

To achieve the above-mentioned objects, an aspect of the present invention may inhere in a semiconductor substrate, encompassing a GaN substrate having a surface, an orientation of which is defined by an absolute value of an off-angle of the surface from {0001} plane towards <1-100> direction lying in a range of 0.12 degree to 0.35 degree and by an absolute value of an off-angle of the surface from {0001} plane towards <11-20> direction lying in a range of 0.00 degree to 0.06 degree; and a single-crystal layer formed of III-V nitride compound semiconductor epitaxially grown on the surface of the GaN substrate.

Another aspect of the present invention may inhere in a semiconductor light-emitting device, encompassing: a GaN substrate having a surface, an orientation of which is defined by an absolute value of an off-angle of the surface from {0001} plane towards <1-100> direction lying in a range of 0.12 degree to 0.35 degree and by an absolute value of an off-angle of the surface from {0001} plane towards <11-20> direction lying in a range of 0.00 degree to 0.06 degree; a single-crystal layer formed of III-V nitride compound semiconductor epitaxially grown on the surface of the GaN substrate; and a light-emitting layer formed of epitaxially grown III-V nitride compound semiconductor provided on the single-crystal layer.

A still another aspect of the present invention may inhere in a semiconductor device, encompassing: a GaN substrate having a surface, an orientation of which is defined by an absolute value of an off-angle of the surface from {0001} plane towards <1-100> direction lying in a range of 0.12 degree to 0.35 degree and by an absolute value of an off-angle of the surface from {0001} plane towards <11-20> direction lying in a range of 0.00 degree to 0.06 degree; and a device-structure portion formed of epitaxially grown III-V nitride compound semiconductor provided on the GaN substrate.

DETAILED DESCRIPTION OF THE INVENTION

Figure 1:
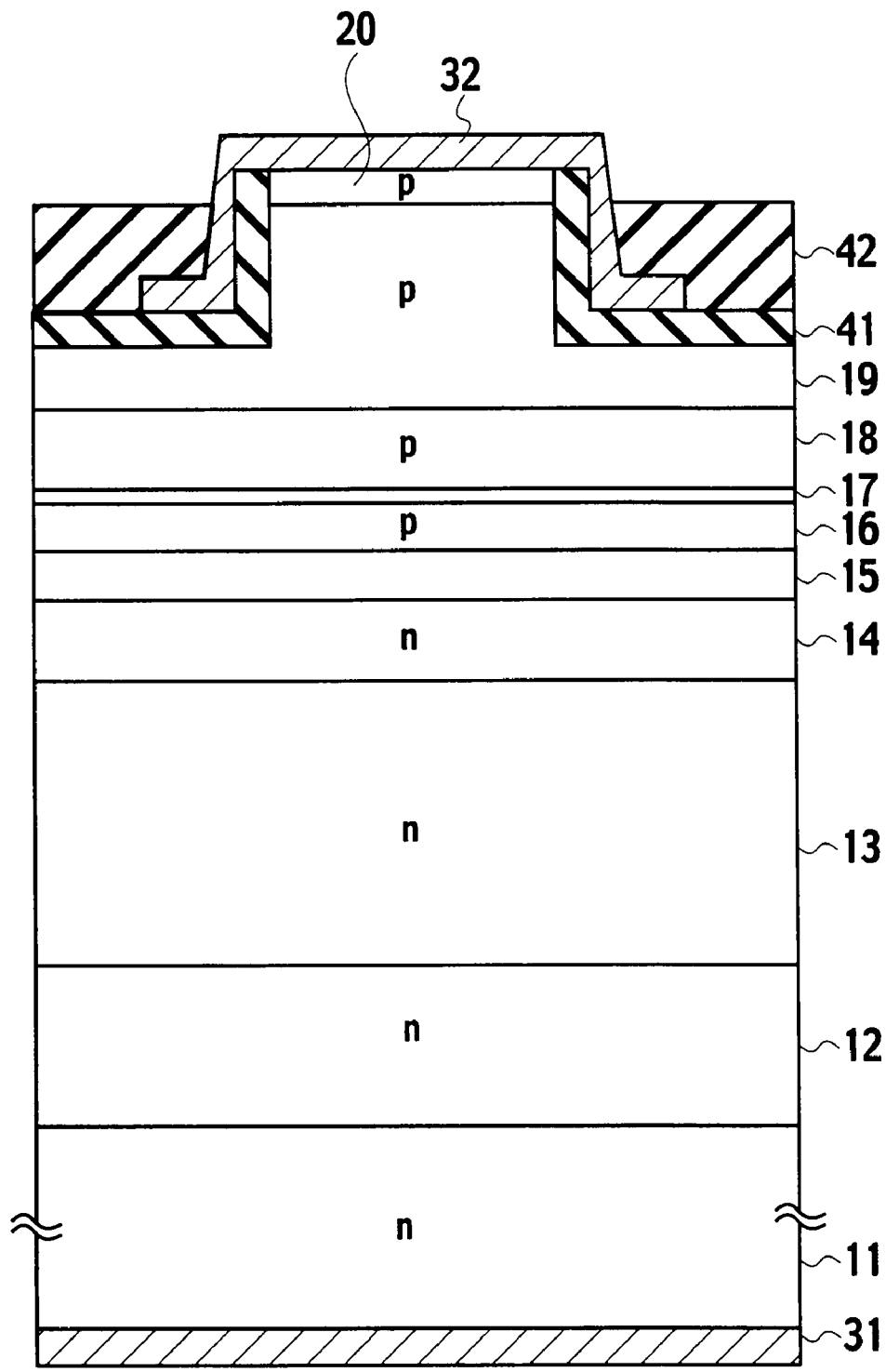
FIG. 1 is a schematic diagram showing a cross-sectional structure of a semiconductor device (laser diode), according to a first embodiment of the present invention.

In the following description specific details are set forth, such as specific materials, process and equipment in order to provide a thorough understanding of the present invention. It will be apparent, however, to one skilled in the art that the present invention may be practiced without these specific details. In other instances, well-known manufacturing materials, process and equipment are not set forth in detail in order not to unnecessary obscure the present invention.

Applicants will first summarize the preliminary consideration of the invention before embarking on a detailed description of each embodiment with reference to the drawings. Namely, while the inventors have repeated trial-manufacturing various III-V nitride compound semiconductors on a GaN substrate, there were cases where originally expected device characteristics of a high-performance III-V nitride compound semiconductor were not obtained. For example, when crystal growth of a laser structure of a III-V nitride compound semiconductor on a GaN substrate was carried out, there were cases where a giant step of an order of several ten to several hundred micrometers was found through observing surface morphology of the grown layers using a Nomarski microscope.

When trial-manufacturing a III-V nitride compound blue-violet laser diode using a sequence of formation processes on such III-V nitride compound semiconductor wafer having poor surface morphology, there were cases where the threshold current increased, which emanates from an increased energy loss and an expanded gain distribution developed due to flatness fluctuation in the interface, through which light propagates. In other words, it is revealed that expected device characteristics of the III-V nitride compound semiconductor cannot be obtained as long as a countermeasure against development of giant steps of the order of several ten to several hundred micrometer on the surface of the crystal-grown layer of a III-V nitride compound semiconductor is not taken when fabricating the III-V nitride compound semiconductor on a GaN substrate.

Various embodiments of the present invention will be described for preventing development of giant steps on the surface of a crystal-grown layer of a III-V nitride compound semiconductor so as to achieve an improved flatness, and high-performance devices are described in first, second and third embodiments of the present invention, with reference to the accompanying drawings. It is to be noted that the same or similar reference numerals are applied to the same or similar parts and elements throughout the drawings, and the description of the same or similar parts and elements will be omitted or simplified. Generally and as it is conventional in the representation of semiconductor devices and semiconductor light-emitting devices, it will be appreciated that the various drawings are not drawn to scale from one figure to another nor inside a given figure, and in particular that the layer thicknesses are arbitrarily drawn for facilitating the reading of the drawings.

It should be noted from the following description of the first, second and third embodiments that a "device-structure portion" does not necessarily mean an entire device-structure of a semiconductor electronic device or a semiconductor optical device as long as it includes a primary structure portion that bears the main operations of the semiconductor electronic device or the semiconductor optical device, such as a light emitting layer and a peripheral structure of the light emitting layer in a laser diode or an LED, a structure around a base region that controls the main current flowing between emitter and collector regions in a heterojunction bipolar transistor (HBT) and a structure around a channel layer through which the main current flowing between source and drain regions in a high electron mobility transistor (HEMT).

It is to be understood that the indicator "+" in the Figures indicates relatively strong doping and the indicator "−" in the Figures indicates relatively weak doping. Prepositions, such as "on", "over", "under", "beneath", and "normal" are defined with respect to a planar surface of the substrate, regardless of the orientation in which the substrate is actually held. A layer is on another layer even if there are intervening layers

FIRST EMBODIMENT

As shown in FIG. 1, a semiconductor device according to a first embodiment of the present invention is fabricated on a semiconductor substrate (11, 12) embracing an n-type GaN substrate 11 and an n-type GaN layer 12 grown on the n-type GaN substrate 11, the n-type GaN layer 12 is doped with n-type impurity atoms such as silicon (Si) atoms.

Note that the n-type GaN layer 12 is merely an example. More generally, the n-type GaN layer 12 may be an n-type single-crystal layer of another III-V nitride compound semiconductor such as an $In_xGa_{1-x-y}Al_yN$ layer. The n-type GaN substrate 11 has a surface orientation, which is defined by the absolute value of an off-angle $\Delta\theta_{1-100}$ of a surface from {0001} plane towards <1-100> direction and absolute value of an off-angle $\Delta\theta_{11-20}$ of the surface from {0001} plane towards <11-20> direction, where those absolute values are represented by:

$$0.12 \text{ degree} \leq |\Delta\theta_{1-100}| \leq 0.35 \text{ degree} \quad (1)$$

$$0.00 \text{ degree} \leq |\Delta\theta_{11-20}| \leq 0.06 \text{ degree} \quad (2)$$

Here, <1-100> direction represents a full set of equivalent directions such as [1-100], [10-10], [-1100], [-1010], [01-10], [0-110] directions in hexagonal symmetry, <11-20> direction represents a full set of equivalent directions such as [11-20], [1-210], [-2110], [-1-120], [-12-10], [2-1-10] directions in hexagonal symmetry. As well known in the art, in the representation of Miller indices, if a plane has negative intercept, the negative number is denoted by "a bar" over the index. Instead of using "a bar" over the index, we denote "−" just before the subject index. For example, <1-100> is pronounced "one, bar one, zero, zero." A device-structure portion of a laser diode is formed on the first stacked structure (11, 12) embracing the n-type GaN substrate 11 and the n-type GaN layer 12 grown on the n-type GaN substrate 11. In the first embodiment, the first stacked structure (11, 12) is referred as the "semiconductor substrate (11, 12)", which may be referred as the "epitaxial substrate (11, 12)" in general, and the device-structure portion is successively grown through epitaxy on the semiconductor substrate (11, 12).

The device-structure portion is implemented by a second stacked structure (13, 14, 15, 16, 17, 18, 19, 20) as a base structure encompassing an n-type cladding layer 13, an n-type GaN light-guiding layer 14 on the n-type cladding layer 13, an active layer (light-emitting layer) 15 on the n-type GaN light-guiding layer 14, a first p-type GaN light-guiding layer 16 on the active layer (light-emitting layer) 15, an overflow preventing layer 17 on the first p-type GaN light-guiding layer 16, a second p-type GaN light-guiding layer 18 on the overflow preventing layer 17, a p-type cladding layer 19 on the second p-type GaN light-guiding layer 18, and a p-type GaN contact layer 20 on the p-type cladding layer 19; wherein the n-type cladding layer 13 or the lowest layer contacts with the top surface of the n-type GaN layer 12 of the semiconductor substrate (11, 12). Note that in the semiconductor device according to the first embodiment, the "device-structure portion" means a principal structure that bears the main operations of the laser diode, which is implemented by the second stacked structure (13, 14, 15, 16, 17, 18, 19, 20) shown in FIG. 1 as a base structure, and does not include the first stacked structure (11, 12). In other words, as already described, the "device-structure portion" does not necessarily mean the entire device structure of an optical semiconductor as long as it includes a principal structure that bears the main operations of the semiconductor optical device.

The n-type cladding layer 13 is a superlattice made up of an undoped $Al_{0.1}Ga_{0.9}N$ layer and a GaN layer doped with approximately $1\times10^{18}$ $cm^{-3}$ of n-type impurity atoms such as Si atoms, but is not limited to the superlattice, and may be a single layer film (approximate thickness of 1.5 micrometer) of an n-type III-V nitride compound semiconductor made of an $Al_{0.05}Ga_{0.95}N$ layer or the like, for example. In addition, a superlattice made up of an undoped $Al_{0.1}Ga_{0.9}N$ layer and a GaN layer doped with approximately $1\times10^{18}$ $cm^{-3}$ of n-type impurity atoms is used; however, the effectiveness of the present invention do not change even if both the $Al_{0.1}Ga_{0.9}N$ layer and the GaN layer are doped with n-type impurity atoms such as Si atoms. The n-type GaN light-guiding layer 14 is an approximately 0.1-micrometer-thick GaN layer doped with approximately $1\times10^{18}$ cm$^{-3}$ of n-type impurity atoms such as Si atoms; however, more generally, it may be an n-type III-V nitride compound semiconductor layer of $In_xGa_{1-x-y}Al_yN$ or the like.

The active layer (light-emitting layer) 15 is implemented by a multi-quantum well (MQW) made up of three quantum well (QW) layers, which are made of approximately 3.5-nm-thick undoped $In_{0.1}Ga_{0.9}N$ layers, and barrier layers, which are made of approximately 7-nm-thick undoped $In_{0.01}Ga_{0.99}N$ layers, respectively, alternately stacked and sandwiching the quantum well. The indium mole fraction x of the $In_xGa_{1-x}N$ layers implementing the MQW is merely an example, and the effectiveness of the present invention do not change even if another value is used as long as the mole fraction x of the QW layer is greater than the mole fraction x of the barrier layer. For example, $In_{0.08}Ga_{0.92}N$ layers may be used for the QW layers, and $In_{0.02}Ga_{0.98}N$ layers or the like may be used for the barrier layers.

The first p-type GaN light-guiding layer 16 provided on the active layer (light-emitting layer) 15 should be formed with a thickness of about 0.03 micrometer.

The overflow preventing layer 17 is a layer for preventing overflow of electrons and is made of an approximately 10-nm-thick $Al_{0.2}Ga_{0.8}N$ layer doped with approximately $5\times10^{18}$ cm$^{-3}$ of p-type impurity atoms such as magnesium (Mg) atoms. The second p-type GaN light-guiding layer 18 is an approximately 0.1-micrometer-thick GaN layer doped with approximately 5 to $10\times10^{18}$ cm$^{-3}$ of p-type impurity atoms such as Mg atoms; however, more generally, it may be a p-type III-V nitride compound semiconductor layer of $In_xGa_{1-x-y}Al_yN$ or the like.

The p-type cladding layer 19 is a superlattice made up of an undoped $Al_{0.1}Ga_{0.9}N$ layer and a GaN layer doped with p-type impurity atoms such as Mg atoms, but is not limited the superlattice, and may be a single layer film (approximate thickness of 0.6 micrometer) of a p-type III-V nitride compound semiconductor doped with approximately $1\times10^{19}$ cm$^{-3}$ Mg concentration made of an $Al_{0.05}Ga_{0.95}N$ layer or the like, for example. In addition, a superlattice made up of an undoped $Al_{0.1}Ga_{0.9}N$ layer and a GaN layer doped with p-type impurity atoms is used; however, the effectiveness of the present invention do not change even if both the $Al_{0.1}Ga_{0.9}N$ layer and the GaN layer are doped with p-type impurity atoms such as Mg atoms. The p-type GaN contact layer 20 is an approximately 0.05-micrometer-thick GaN layer doped with approximately $2\times10^{20}$ cm$^{-3}$ of p-type impurity atoms such as Mg atoms; however, more generally, it may be a p-type III-V nitride compound semiconductor layer of $In_xGa_{1-x-y}Al_yN$ or the like.

Note that metal-organic chemical vapor deposition (MOCVD) is used for epitaxially growing the second stacked structure (13, 14, 15, 16, 17, 18, 19, 20) shown in FIG. 1. A two-micrometer-width ridge structure is then formed in the top of the second stacked structure (13, 14, 15, 16, 17, 18, 19, 20), by etching process as a device fabrication process, so that the stacked structure of the p-type cladding layer 19 and the p-type GaN contact layer 20 has a protrusion at the center implementing the ridge structure. The p-type cladding layer 19 has a flat portion surrounding the protrusion at the center so as to establish the ridge structure. In other words, the p-type cladding layer 19 itself has a reverse-T-shaped step structure made of a protruded portion and a flat portion serving as a base for the protruded portion. The p-type GaN contact layer 20 is then provided on top of the protrusion made of the p-type cladding layer 19. The ridge structure implemented by the stacked protrusion, encompassing the p-type cladding layer 19 and the p-type GaN contact layer 20, extends perpendicular to the plane of the paper. Note that the ridge structure is not limited to a rectangular ridge having a cross-section with vertical sidewalls as shown in FIG. 1, and may form a trapezoidal ridge having mesa slants in a cross-sectional view.

Insulating films 41 are provided as "current blocking layers" sandwiching the ridge structure (protrusion) on the p-type cladding layer 19, which forms a couple of flat portions surrounding the protrusion, and the current blocking layers prevent an laser oscillation at transverse mode. Thickness of the current blocking layers may be arbitrarily selected according to the design of the laser in a range from approximately 0.3 μm to 0.8 micrometer, and may be set to, for example, a value approximately 0.5 micrometer. The current blocking layers may be made of a high resistivity semiconductor layer such as an AlN layer or an $Al_{0.2}Ga_{0.8}N$ layer, a proton irradiated semiconductor layer, a silicon oxide film ($SiO_2$ film), or a zirconium oxide film ($ZrO_2$ film). Furthermore, it may be a multilayer film made up of a $SiO_2$ film and a $ZrO_2$ film, for example. In other words, various materials having a lower refractive index than that of the III-V nitride compound semiconductor used for the active layer (light-emitting layer) 15 may be used for the current blocking layers. An n-type semiconductor layer such as n-type GaN or n-type $Al_yGa_{1-y}N$ may be used as the current blocking layers instead of using the insulating film 41 against the ridge structure implemented by the p-type cladding layer 19 and the p-type GaN contact layer 20 so as to establish a pn-junction isolation.

A p-side electrode (anode electrode) 32 made of a palladium-platinum-gold (Pd/Pt/Au) composite film, for example, is provided on the p-type GaN contact layer 20. The Pd film is about 0.05 micrometer thick, the Pt film is about 0.05 micrometer thick, and the Au film is about one micrometer thick, for example. An n-side electrode (cathode electrode) 31 made of a titanium-platinum-gold (Ti/Pt/Au) composite film is provided on the bottom surface of the n-type GaN substrate 11. For example, the n-side electrode (cathode electrode) 31 may be implemented by about 0.05-micrometer-thick Ti film, about 0.05-micrometer-thick Pt film, and about one-micrometer-thick Au film. End faces of a laser resonator are formed by cleaving. A high-reflection coat film is applied on the rear-end face, which is the opposite side to the front-end face from which laser light is emitted.

Note that the n-type cladding layer 13, the n-type GaN light-guiding layer 14, the active layer (light-emitting layer) 15, the first p-type GaN light-guiding layer 16, the overflow preventing layer 17, the second p-type GaN light-guiding layer 18, the p-type cladding layer 19, and the p-type GaN contact layer 20 providing the device-structure portion are merely examples, and the present invention is not limited to these materials. More generally, an appropriate single-crystal layer of another III-V nitride compound semiconductor such as an $In_xGa_{1-x-y}Al_yN$ layer may be used depending upon the design choice. Accordingly, the indium mole fraction x of the $In_xGa_{1-x}N$ layer and the aluminum mole fraction y of the $Al_yGa_{1-y}N$ layer mentioned above should be understood as mere examples, and the following effectiveness may naturally be achieved even using other mole fraction values.

Figure 2:
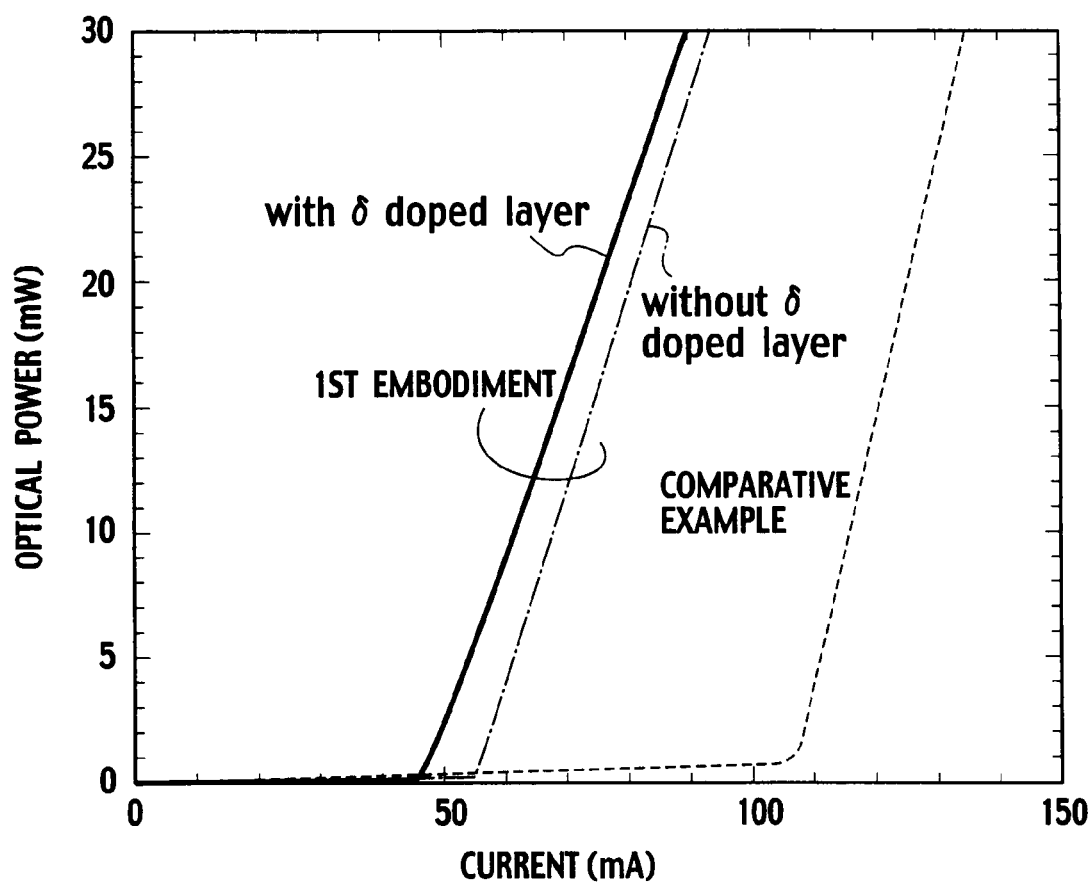
FIG. 2 is a diagram showing current vs. light output power characteristics of the semiconductor device (laser diode) under a continuous oscillation conditions at 25 degrees Celsius, according to the first embodiment of the present invention, which compare with the current vs. light output power characteristics of a comparative example under the same condition.
Figure 11:
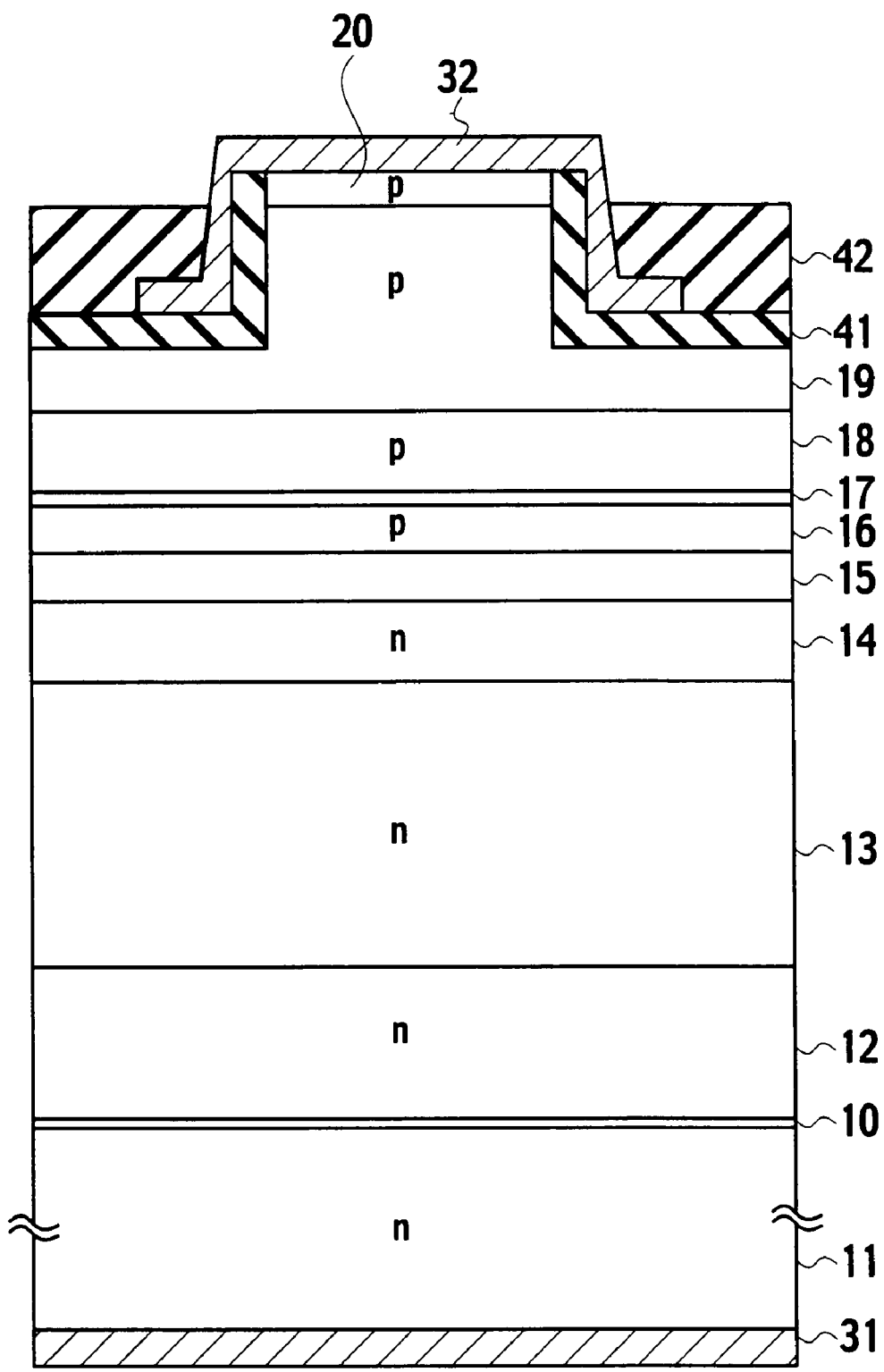
FIG. 11 is a schematic diagram showing a cross-sectional structure of a semiconductor device (laser diode), according to a modification of the first embodiment of the present invention.

FIG. 2 shows a current vs. light output power characteristics of the semiconductor device (laser diode) according to the first embodiment of the present invention under a continuous oscillation condition at 25 degrees Celsius, and compares with the current vs. light output power characteristics of a comparative example under the same condition. The current vs. light output power characteristic indicated by a solid line in FIG. 2 is a result of a structure incorporating a δ-doped layer 10 as shown in FIG. 11 on the GaN substrate 11 that has a surface orientation satisfying the relationship of Equations (1) and (2) in terms of off angles $\Delta\theta_{1\text{-}100}$ and $\Delta\theta_{11\text{-}20}$. The average threshold current of the laser diode with δ-doped layer 10 is approximately 45 milliamperes. The current vs. light output power characteristic indicated by a dashed-and-dotted line in FIG. 2 is a result of a structure without incorporating the δ-doped layer 10 as shown in FIG. 11 on the GaN substrate 11, but the GaN substrate 11 has a surface orientation satisfying the relationship of Equations (1) and (2) in terms of off angles $\Delta\theta_{1\text{-}100}$ and $\Delta\theta_{11\text{-}20}$. The average threshold current of the laser diode without δ-doped layer 10 is approximately 55 milliamperes. The comparative example indicated by a broken line in FIG. 2 is of a laser diode fabricated by growing the above-mentioned laser structure on the {0001}-orientated n-type GaN substrate 11 that does not satisfy the relationship of Equations (1) and (2) in terms of the off angles $\Delta\theta_{1\text{-}100}$ and $\Delta\theta_{11\text{-}20}$. The average threshold current found from the current vs. light output power characteristics of the laser diode according to the comparative example is 106 milliamperes, and is higher than that for the semiconductor device according to the first embodiment. The higher average threshold current with the structure of the comparative example is due to occurrence of fluctuation of the flatness in the boundary surface through which light propagate. Therefore, it is understood that the structure of the comparative example establishes a wider gain distribution and increased energy loss than the structure of the first embodiment.

Figure 3A:
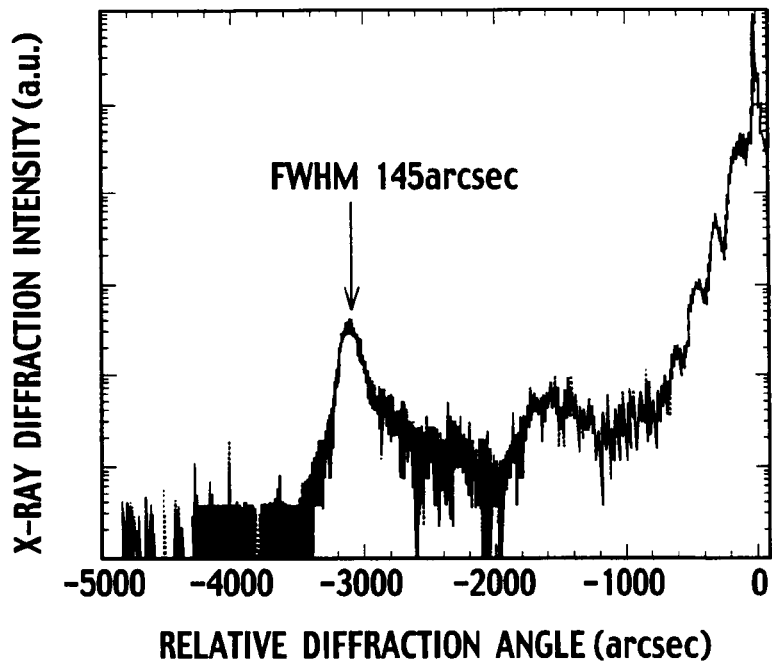
FIG. 3A shows an X-ray diffraction spectrum obtained by ω/2θ scanning across (0002) plane of a stacked structure used for the semiconductor device, the stacked structure is successively epitaxially grown on the GaN substrate, which satisfy a specific surface orientation defined by off angles $\Delta\theta_{1\text{-}100}$ and $\Delta\theta_{11\text{-}20}$, according to the first embodiment of the present invention.
Figure 3B:
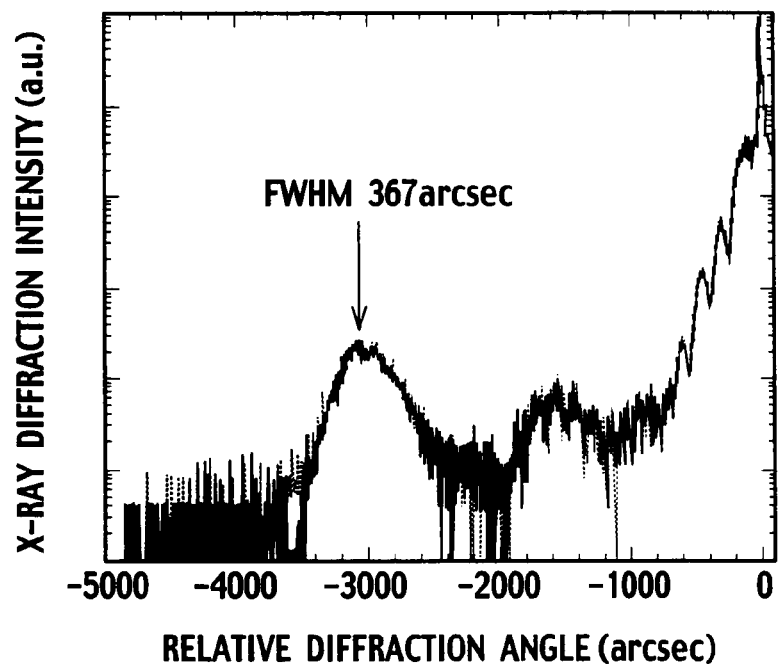
FIG. 3B shows the corresponding X-ray diffraction spectrum obtained by the ω/2θ scanning across (0002) plane of a corresponding stacked structure, the stacked structure is successively epitaxially grown on the GaN substrate, which does not satisfy the specific surface orientation, according to a comparative example.

In addition, a wafer (see FIG. 6) after crystal growth of the semiconductor device (laser diode) according to the first embodiment is compared through rocking curves of X-ray diffraction. FIGS. 3A and 3B show results of ω/2θ scanning across (0002) plane. In the spectrum, the peak at 0 arcsec, shown on the right end of FIGS. 3A and 3B, corresponds to a diffraction from the GaN layer. Since the n-type cladding layer 13 is a superlattice made up of n-type $Al_{0.1}Ga_{0.9}N$ layers and n-type GaN layers, and the p-type cladding layer 19 is a superlattice made up of p-type $Al_{0.1}Ga_{0.9}N$ layers and p-type GaN layers, two satellite peaks at a negative first order and a positive first order diffraction corresponding to the period of superlattice, for example, can be detected in addition to the peak at the zero order diffraction. Namely, the satellite peaks observed near −3200 arcsec in FIGS. 3A and 3B are the negative first order satellite peaks ascribable to the $Al_{0.1}Ga_{0.9}N$/GaN superlattice.

As shown in FIG. 3A, the full width at half maximum (FWHM) of the satellite peak for the wafer with the above-mentioned laser structure grown on the GaN substrate 11, which has a surface orientation satisfying the relationship of Equations (1) and (2) in terms of the off angles $\Delta\theta_{1\text{-}100}$ and $\Delta\theta_{11\text{-}20}$, is 145 arcsec. On the other hand, as shown in FIG. 3B, the FWHM of the satellite peak for the wafer with the above-mentioned laser structure grown on the {0001}-orientated GaN substrate 11 that does not satisfy the relationship of Equations (1) and (2) in terms of the off angles $\Delta\theta_{1\text{-}100}$ and $\Delta\theta_{11\text{-}20}$ is 367 arcsec, which is wide. The FWHM being wide means that the steepness at the superlattice interfaces and the surface flatness of the film, observing the entire area of the cladding layer, are poor.

Figure 4:
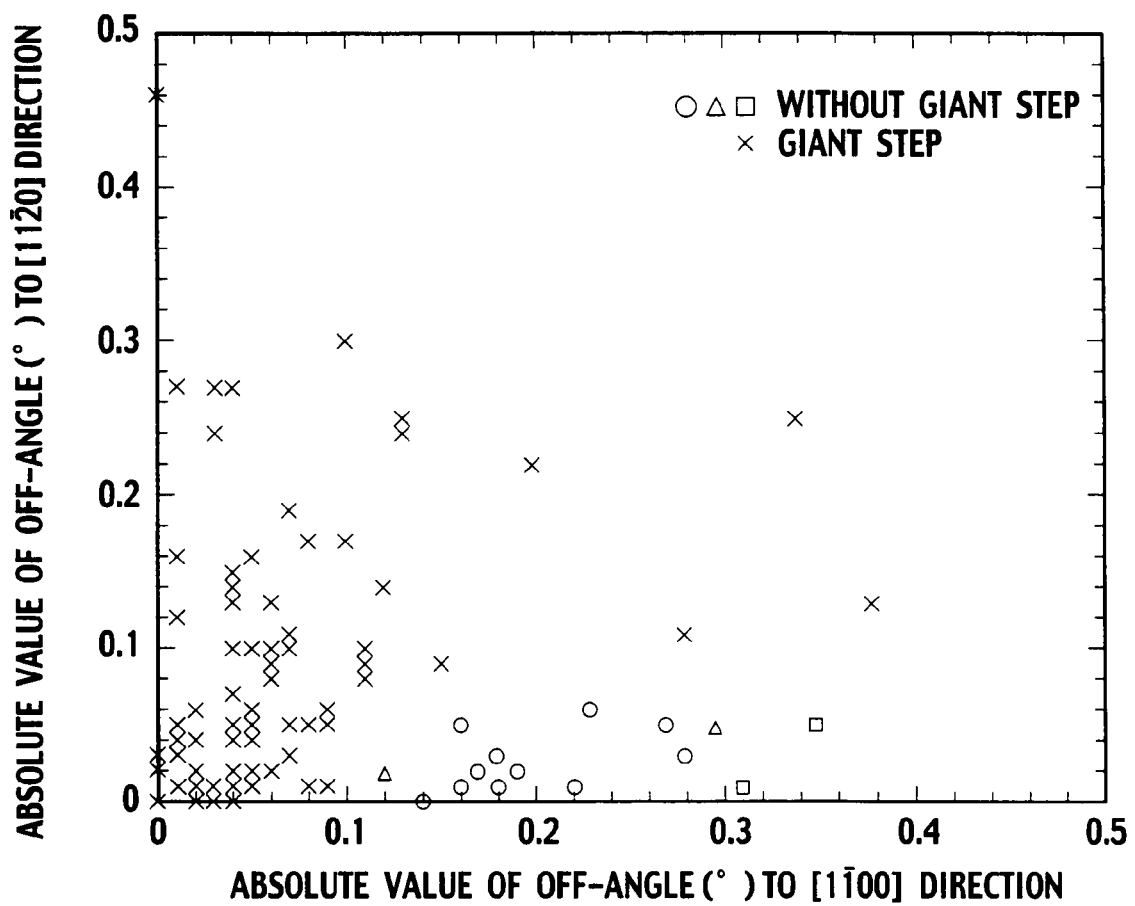
FIG. 4 is diagram showing surface morphology of various epitaxially grown stacked structures, which are examined so as to determine an optimum condition for the semiconductor device according to the first embodiment of the present invention, using multiple GaN substrates having various directions of crystal planes, by plotting absolute values of an off-angle $\Delta\theta_{1\text{-}100}$ from {0001} plane towards [1-100] direction along abscissa and absolute values of an off-angle $\Delta\theta_{11\text{-}20}$ from {0001} plane towards [11-20] direction along ordinate.

Results of observing the grown wafer through a Nomarski microscope are given in FIG. 4. In FIG. 4, absolute values of an off-angle $\Delta\theta_{1\text{-}100}$ of a surface from {0001} plane towards [1-100] direction are plotted along abscissa, and absolute values of an off-angle $\Delta\theta_{11\text{-}20}$ of the surface from {0001} plane towards [11-20] direction are plotted along ordinate. In FIG. 4, favorable flatness with which there is no giant step is observed within the range of the absolute values of the respective off-angles $\Delta\theta_{1\text{-}100}$ between 0.12 degree and 0.35 degree and within range of absolute values of the respective off-angles $\Delta\theta_{11\text{-}20}$ between 0.00 degree and 0.06 degree, as represented by symbols of open circle (○), open triangle (△) and open square (□). It is further preferable that the absolute values of the respective off-angles $\Delta\theta_{1\text{-}100}$ lie within range of 0.12 degree and 0.30 degree and within range of absolute values of the respective off-angles $\Delta\theta_{11\text{-}20}$ between 0.00 degree and 0.06 degree, as represented by open triangle symbols and open circle symbols, because the FWHM of x-ray diffraction-rocking curve lie in a range of 200 to 250 arcsec and a flat surface can be obtained. It is even further preferable that the absolute values of the respective off-angles $\Delta\theta_{1\text{-}100}$ lie within range of 0.14 to and 0.28 degree and within range of absolute values of the respective off-angles $\Delta\theta_{11\text{-}20}$ between 0.00 degree and 0.06 degree, as represented by open circle symbols, because the FWHM of x-ray diffraction-rocking curve becomes approximately 150 arcsec and a mirror surface can be obtained without no presence of giant step. In other words, while the surface morphology of the above-mentioned wafer, in which a laser structure as shown in FIG. 1 is grown on the GaN substrate 11, the GaN substrate 11 having the orientation of crystal plane satisfying the relationship of Equations (1) and (2) in terms of off angles $\Delta\theta_{1\text{-}100}$ and $\Delta\theta_{11\text{-}20}$, achieves a very smooth mirror surface required for device dimensions, the surface morphology of the wafer, in which the laser structure is grown on the {0001}-orientated GaN substrate 11 that do not satisfy the relationship of Equations (1) and (2) in terms of off angles $\Delta\theta_{1\text{-}100}$ and $\Delta\theta_{11\text{-}20}$, establishes giant steps in the order of several ten to several hundred micrometer so as to form an uneven surface.

As such, since the semiconductor substrate (epitaxial substrate) according to the first embodiment is grown on the GaN substrate 11, there are essentially few problems of defects such as threading dislocation and cracks in the epitaxially grown layer, the defects are ascribable to the lattice mismatch with the substrate. Also, since the orientation of crystal plane of the GaN substrate 11 is optimized, an epitaxially grown layer of a III-V nitride compound semiconductor with favorable surface morphology and surface flatness is obtained. Furthermore, the semiconductor device (laser diode) according to the first embodiment using the semiconductor substrate (epitaxial substrate) with excellent surface flatness facilitates fabrication of a waveguide with little optical loss, and provision of a reduced threshold current, an increased operating life, and improved reliability. In addition, according to the semiconductor device (laser diode) associated with the first embodiment, spatial expansion of gain distribution is prevented, thereby providing a high efficiency device.

[Device Fabrication]

A fabrication method for the semiconductor device (laser diode), according to the first embodiment of the present invention is described with reference to FIGS. 5 through 11. Note that the fabrication method for the semiconductor device described forthwith is merely an example, and the present invention may naturally be implemented using other various fabrication methods including various modifications. For example, a crystal-growth furnace used in the semiconductor device (laser diode) fabrication method according to the first embodiment is described as an MOCVD furnace, but it may be fabricated by another method using another crystal-growth furnace such as a molecular beam epitaxy (MBE) furnace.

Figure 5A:
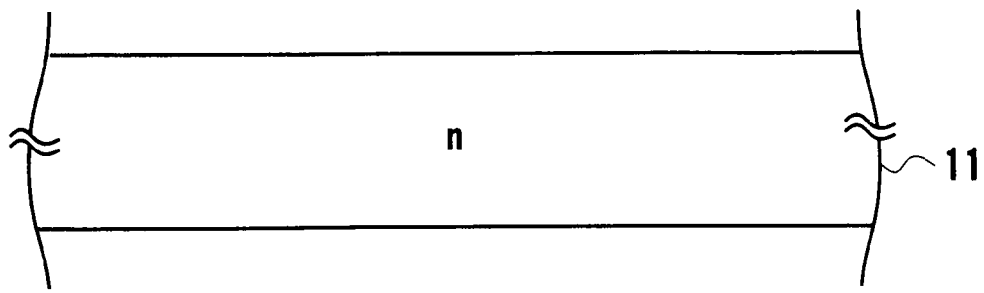
FIG. 5A is a process flow cross sectional view showing an intermediate product of the semiconductor device according to the first embodiment of the present invention, explaining a manufacturing method of the semiconductor device according to the first embodiment.
Figure 5B:
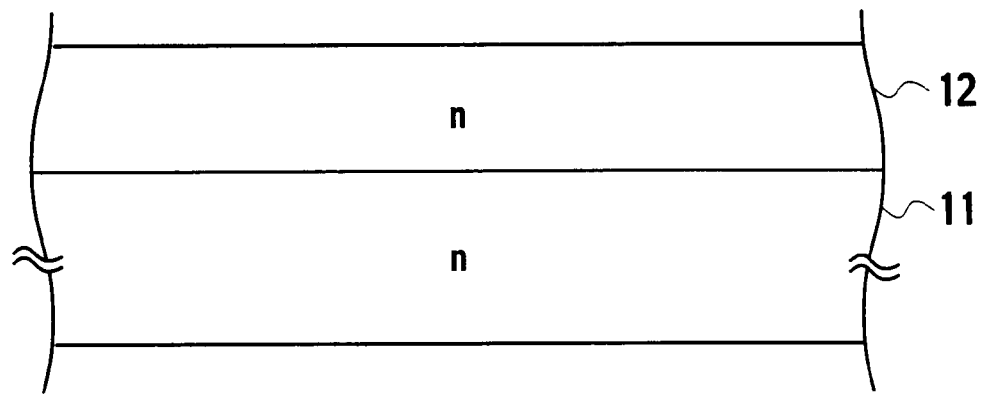
FIG. 5B is a subsequent process flow cross sectional view showing an intermediate product of the semiconductor device according to the first embodiment after the process stage shown in FIG. 5A, explaining the manufacturing method of the semiconductor device according to the first embodiment.

(a) First, a GaN substrate 11 that has a surface orientation satisfying the relationship of Equations (1) and (2) in terms of off angles $\Delta\theta_{1\text{-}100}$ and $\Delta\theta_{11\text{-}20}$ is prepared as shown in FIG. 5A. The GaN substrate 11 is then mounted on a susceptor of an MOCVD furnace. Heat treatment in an ambient including ammonia ($NH_3$) gas, which is a source gas for group V element, is started. A metal-organic Ga compound gas such as trimethyl gallium ($Ga(CH_3)_3$) gas or triethyl gallium ($Ga(C_2H_5)_3$) gas, which is a source gas for group III element, is bubbled with hydrogen ($H_2$) and then introduced in a growth chamber, in which the GaN substrate 11 is heated at a substrate temperature of 1000 to 1100 degrees Celsius. As shown in FIG. 5B, an n-type GaN layer 12 is grown on the GaN substrate 11, providing a semiconductor substrate (11, 12). When growing the n-type GaN layer 12 on the GaN substrate 11, a high V/III ratio of several hundred or greater is preferred. A Si hydride such as monosilane ($SiH_4$) gas or an organic silicon compound gas such as tetramethylsilane ($Si(CH_3)_4$) gas may be used as an n-type doping material.

Figure 5C:
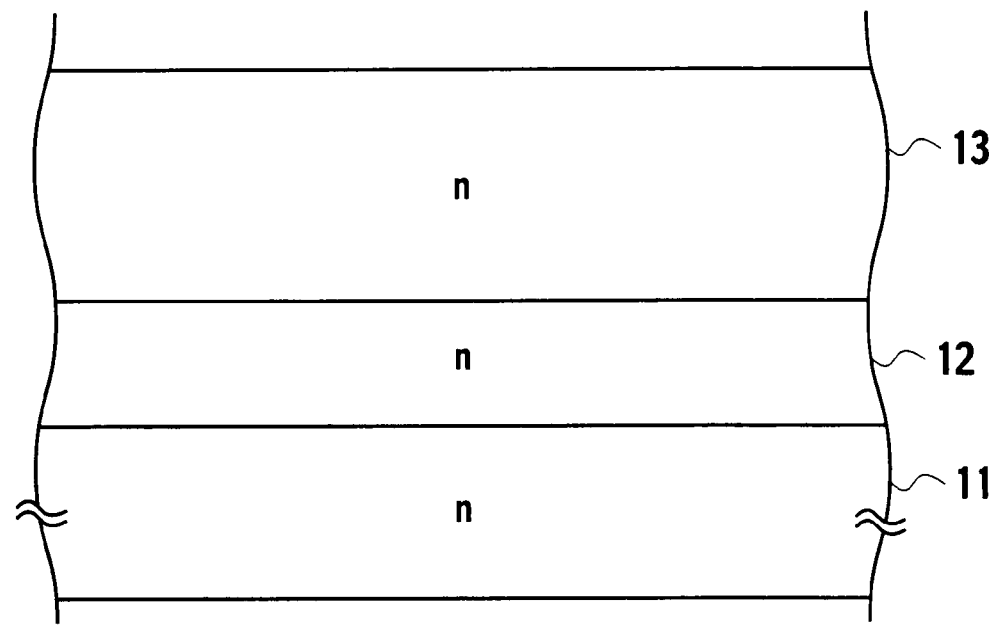
FIG. 5C is a subsequent process flow cross sectional view showing an intermediate product of the semiconductor device according to the first embodiment, after the process stage shown in FIG. 5B, the intermediate product serves as a specific semiconductor substrate (epitaxial substrate) of the first embodiment, explaining the manufacturing method of the semiconductor device according to the first embodiment.
Figure 6:
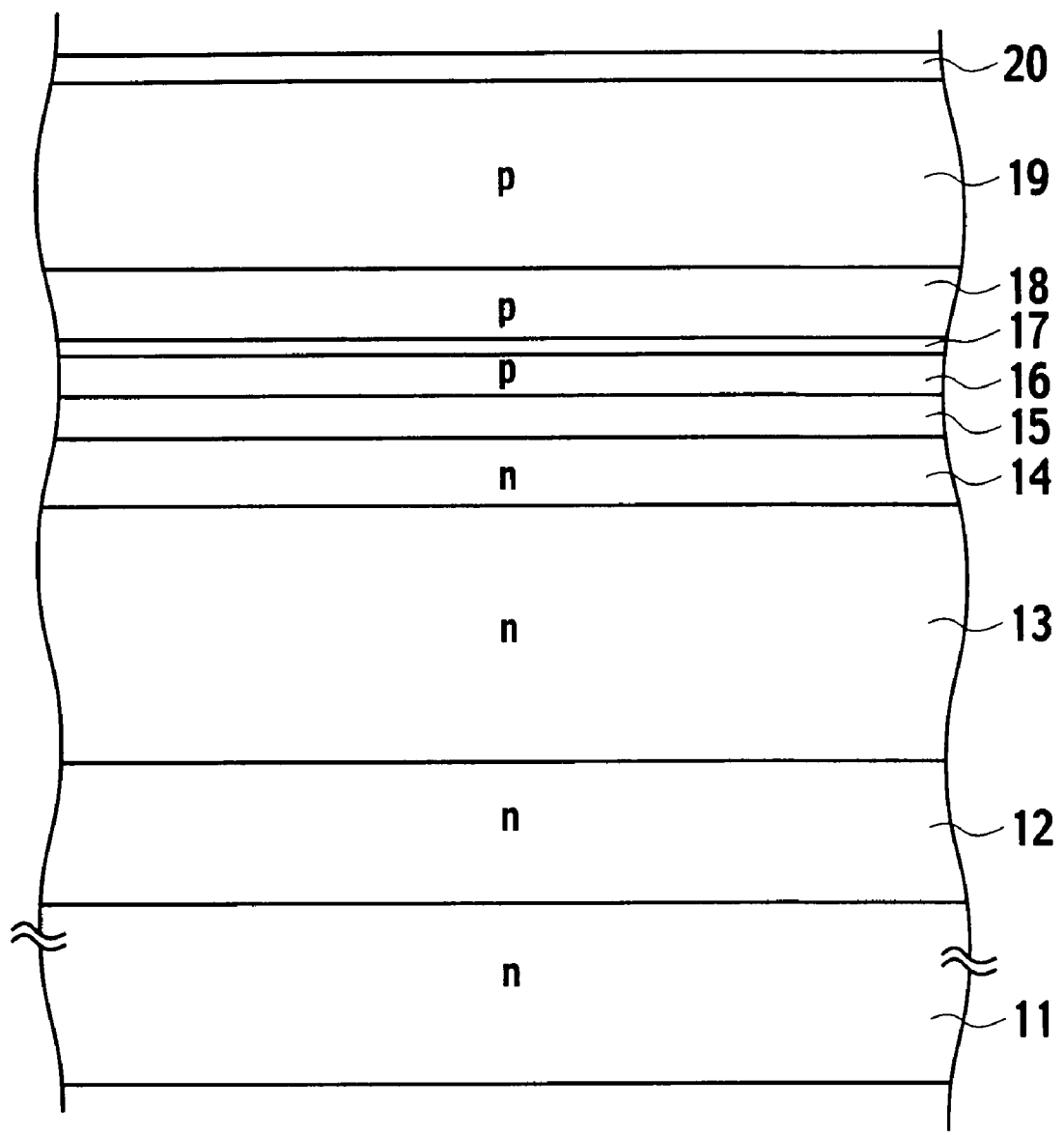
FIG. 6 is a further subsequent process flow cross sectional view showing an intermediate product of the semiconductor device according to the first embodiment after the process stage shown in FIG. 5C, in which a plurality of epitaxial layers are successively grown on the specific semiconductor substrate (epitaxial substrate), explaining the manufacturing method of the semiconductor device according to the first embodiment.

(b) Next, once the substrate temperature is set between 1000 degrees Celsius and 1080 degrees Celsius, successive epitaxial growth is performed for a device-structure portion of the laser diode on the n-type GaN layer 12 of the semiconductor substrate (11, 12). In other words, as shown in FIG. 5C, an n-type cladding layer 13 is grown on the n-type GaN layer 12 through successive epitaxial growth in the same growth chamber (reactor tube). Furthermore, successive to the n-type cladding layer 13, as shown in FIG. 6, an n-type GaN light-guiding layer 14, an active layer (light-emitting layer) 15, a first p-type GaN light-guiding layer 16, an overflow preventing layer 17, a second p-type GaN light-guiding layer 18, a p-type cladding layer 19, and a p-type GaN contact layer 20 are epitaxially grown in consecutive order, forming a double hetero structure. As a group III material, a metal-organic Ga compound such as trimethyl gallium ($Ga(CH_3)_3$) or triethyl gallium ($Ga(C_2H_5)_3$), a metal-organic Al compound such as trimethyl aluminum ($Al(CH_3)_3$) or triethyl aluminum ($Al(C_2H_5)_3$), and a metal-organic In compound such as trimethyl indium ($In(CH_3)_3$) or triethyl indium ($In(C_2H_5)_3$) are available. When growing the epitaxial layers 14, 15, 16, 17, 18, 16 and 20, a high V/III ratio of several hundred or greater is preferred respectively. The n-type cladding layer 13 is about 1.5-micrometer-thick epitaxial layer with about $1\times10^{18}$ $cm^{-3}$ Si concentration, and the n-type GaN light-guiding layer 14 is about 0.1-micrometer-thick epitaxial layer with about $1\times10^{18}$ $cm^{-3}$ Si concentration. The active layer (light-emitting layer) 15 provided on the n-type GaN light-guiding layer 14 has a three-layer cycle MQW structure formed by alternately stacking a quantum well (QW) layer, which is made up of three $In_{0.1}Ga_{0.9}N$ layers, and a barrier layer, which is made up of five $In_{0.01}Ga_{0.99}N$ layers. The first p-type GaN light-guiding layer 16 provided on the active layer (light-emitting layer) 15 is about 0.03-micrometer-thick epitaxial layer, the overflow preventing layer 17 is about 10-nm-thick epitaxial layer with about $5\times10^{18}$ $cm^{-3}$ Mg concentration, the second p-type GaN light-guiding layer 18 is about 0.1-micrometer-thick epitaxial layer with about 5 to $10\times10^{18}$ $cm^{-3}$ Mg concentration, the p-type cladding layer 19 is about 0.6-micrometer-thick epitaxial layer with about $1\times10^{19}$ $cm^{-3}$ Mg concentration, and the p-type GaN contact layer 20 is about 0.05-micrometer-thick epitaxial layer with about $2\times10^{20}$ $cm^{-3}$ Mg concentration. A metal-organic Mg compound such as biscyclopentadienyl magnesium ($Cp_2Mg$ atoms) or bismethyl-cyclopentadienyl magnesium ($M_2Cp_2Mg$ atoms) is available as a p-type doping material.

Figure 7:
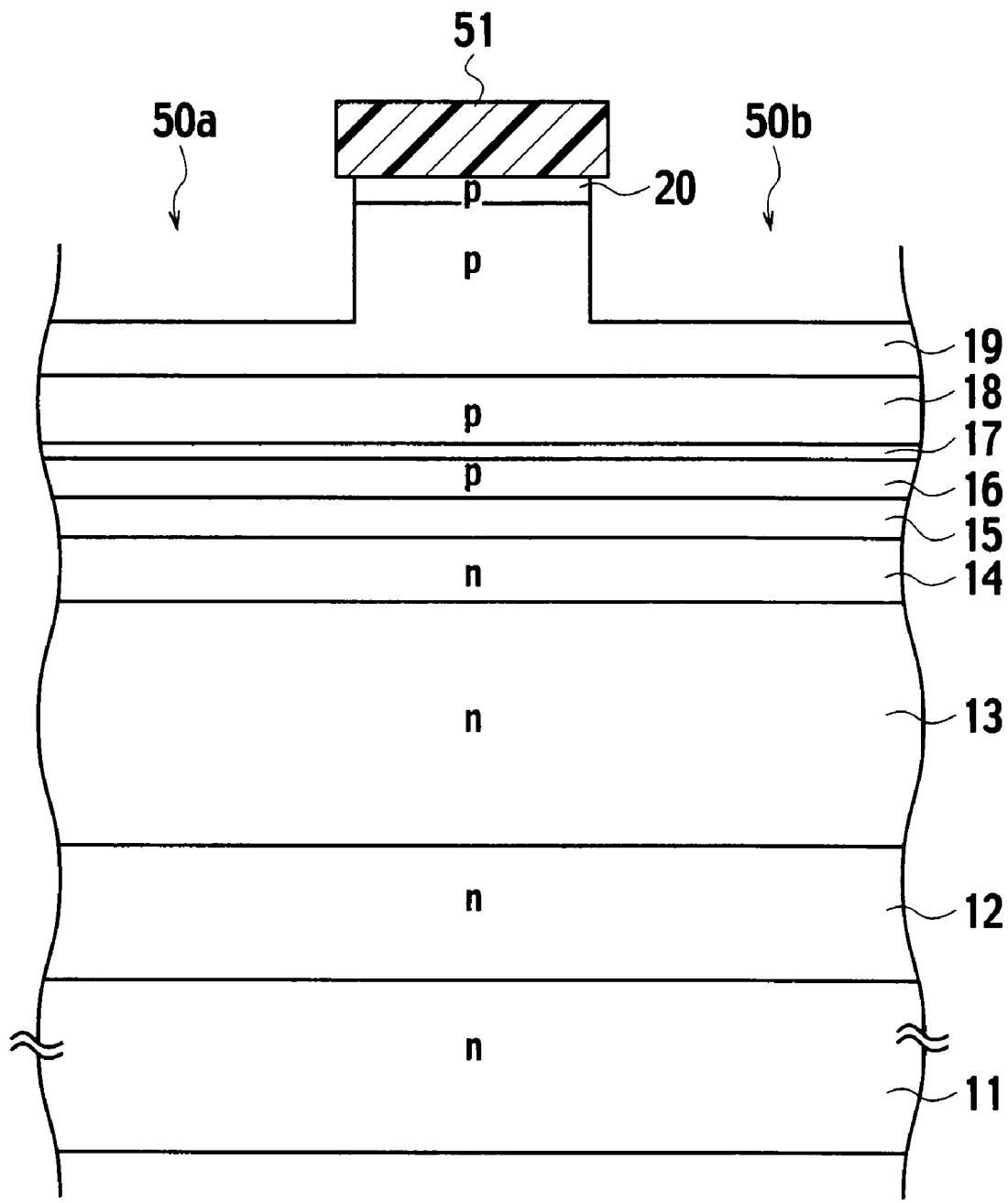
FIG. 7 is a still further subsequent process flow cross sectional view showing an intermediate product of the semiconductor device according to the first embodiment after the process stage shown in FIG. 6, in which a ridge structure is formed at top of the stacked epitaxial layers, successively grown on the specific semiconductor substrate (epitaxial substrate), explaining the manufacturing method of the semiconductor device according to the first embodiment.

(c) Next, as shown in FIG. 7, grooves 50a and 50b are selectively formed by subjecting the p-type cladding layer 19 and the p-type GaN contact layer 20 to reactive ion etching (RIE) using a photoresist 51 as a mask, leaving a protrusion surrounded by the grooves 50a and 50b. The trapezoidal protrusion formed by the p-type cladding layer 19 and the p-type GaN contact layer 20 makes the ridge structure, extending perpendicular to the plane of the paper. In the case where thicknesses of the p-type cladding layer 19 and the p-type GaN contact layer 20 are about 0.6 micrometer and about 0.05 micrometer, respectively, thickness of each of the grooves 50a and 50b should be approximately 0.5 micrometer.

Figure 8:
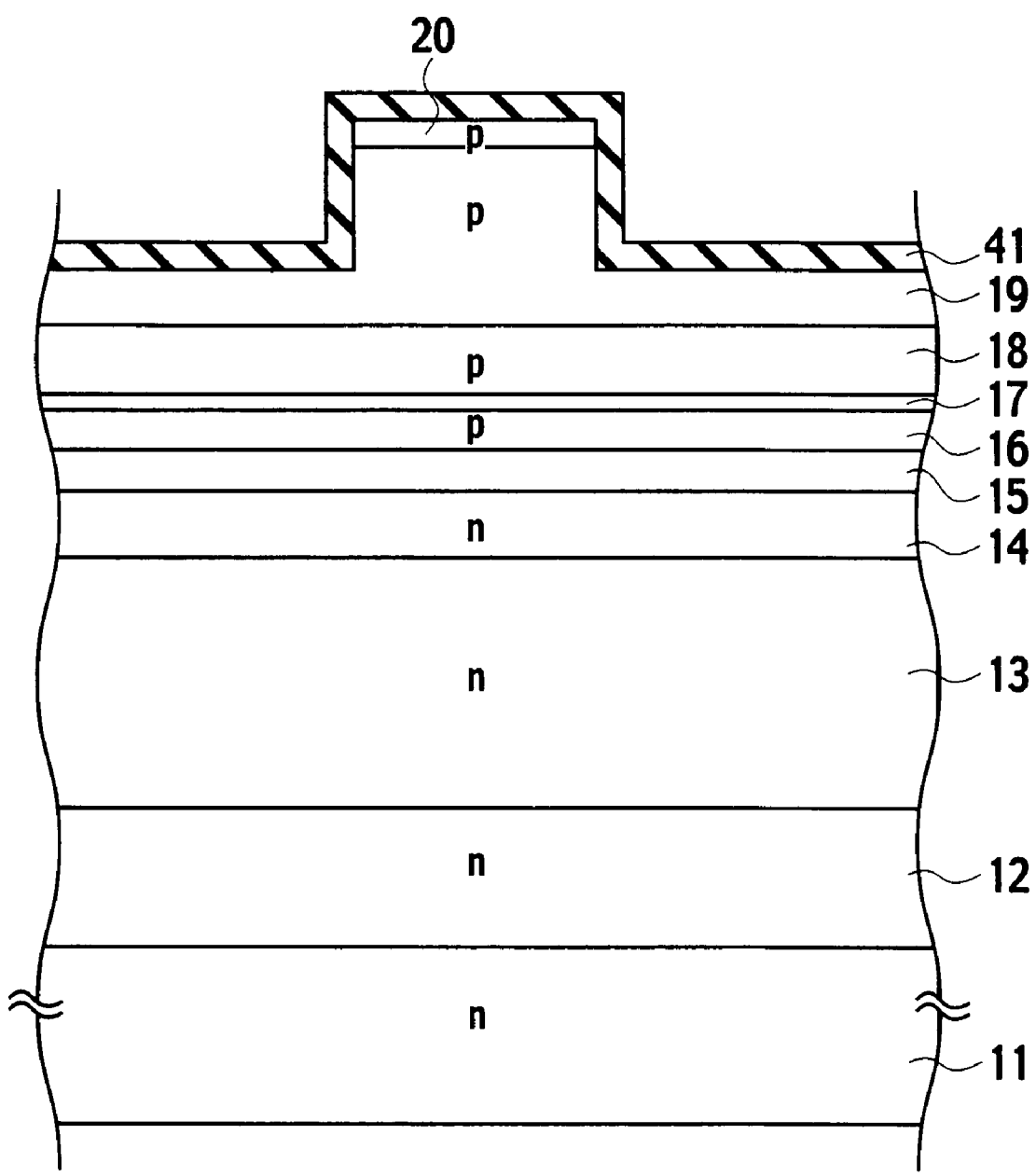
FIG. 8 is a still further subsequent process flow cross sectional view showing an intermediate product of the semiconductor device according to the first embodiment after the process stage shown in FIG. 7, explaining the manufacturing method of the semiconductor device according to the first embodiment.
Figure 9:
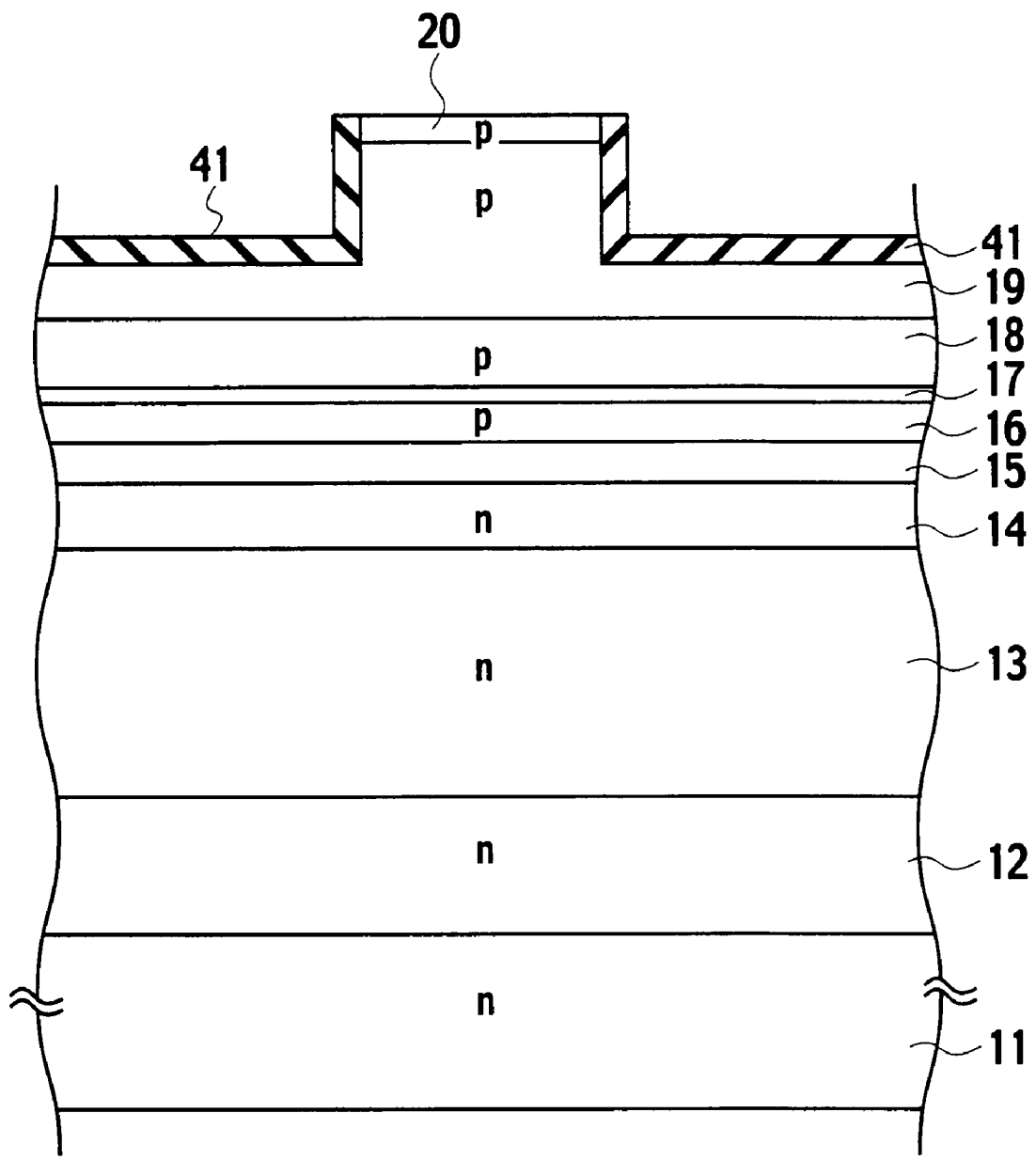
FIG. 9 is a still further subsequent process flow cross sectional view showing an intermediate product of the semiconductor device according to the first embodiment after the process stage shown in FIG. 8, explaining the manufacturing method of the semiconductor device according to the first embodiment.

(d) Next, as shown in FIG. 8, once the photoresist is removed, the grooves 50a and 50b are filled, and about 0.6- to one-micrometer-thick insulating film 41 is then deposited across the entire surface so as to sandwich the ridge (protrusion) formed by the p-type cladding layer 19 and the p-type GaN contact layer 20. For the insulating film 41, a high resistivity semiconductor layer such as an AlN layer may be epitaxially grown or a silicon oxide film ($SiO_2$ film) may be deposited through CVD. As shown in FIG. 9, only the insulating film 41 on the p-type GaN contact layer 20 is then etched until the top surface of the p-type GaN contact layer 20 is laid bare.

Figure 10:
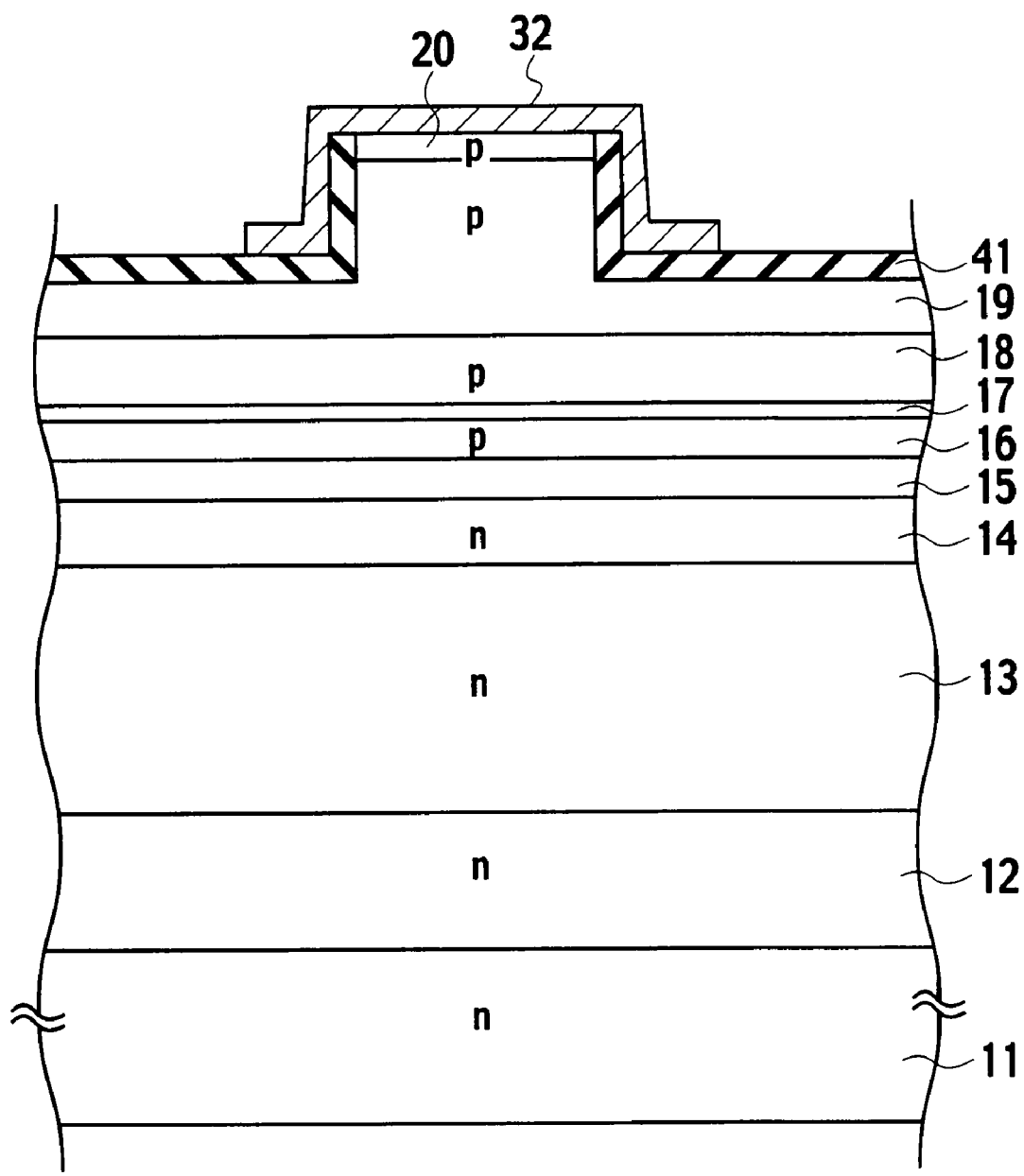
FIG. 10 is a still further subsequent process flow cross sectional view showing an intermediate product of the semiconductor device according to the first embodiment after the process stage shown in FIG. 9, explaining the manufacturing method of the semiconductor device according to the first embodiment.

(e) Next, as shown in FIG. 10, a p-side electrode (anode electrode) 32 made of a palladium-platinum-gold (Pd/Pt/Au) composite film is delineated on the p-type GaN contact layer 20 using a lift-off method. In other words, after a photoresist film having a window corresponding to a pattern for the p-side electrode (anode electrode) 32 is formed on the p-type GaN contact layer 20 and the insulating film 41 on both sides of the p-type GaN contact layer 20, about 0.05-micrometer-thick Pd film, about 0.05-micrometer-thick Pt film and about 1.0-micrometer-thick Au film are successively deposited through vacuum evaporation or sputtering, and the photoresist film is then stripped to leave the p-side electrode (anode electrode) 32 at the position of the window. Furthermore, a passivation film 42 such as a silicon oxide film ($SiO_2$ film), a silicon nitride film ($Si_3N_4$ film) or a polyimide film is deposited so as to cover the p-side electrode (anode electrode) 32 and the insulating film 41 through CVD. Then part of the passivation film 42 is selectively removed so that the top surface of the p-side electrode (anode electrode) 32 comes into view, using etch back method as shown in FIG. 1. Subsequently, a titanium-platinum-gold (Ti/Pt/Au) composite film is deposited on the bottom surface of the GaN substrate 11 through vacuum evaporation or sputtering. For example, about 0.05-micrometer-thick Ti layer, about 0.05-micrometer-thick Pt layer, and about 1.0-micrometer-thick Au layer are successively deposited. Then, by heat treatment (sintering), the contact resistances of both the p-side electrode (anode electrode) 32 and an n-side electrode (cathode electrode) 31 are decreased. A desired size is provided by cleaving or by using a cutting means such as a diamond blade, completing the semiconductor device (laser diode) shown in FIG. 1.

As described above, since epitaxial layers are grown on the GaN substrate 11, according to the semiconductor device fabrication method of the first embodiment of the present invention, there are essentially few problems of defects such as threading dislocation and cracks associated with the lattice mismatch between the epitaxially grown layers and the GaN substrate 11. Also, since the orientation of crystal plane of the GaN substrate 11 is optimized, surface morphology and surface flatness are favorable. Accordingly, a high crystallographic quality III-V nitride compound semiconductor epitaxial layer is grown uniformly on the n-type GaN substrate 11. Therefore, a high-performance III-V nitride compound semiconductor device is provided with excellent yield and at low cost.

Modification of the First Embodiment

As shown in FIG. 11, a semiconductor device (laser diode), according to a modification of the first embodiment of the present invention, is different from the semiconductor device according to the first embodiment of the present invention shown in FIG. 1 in that a stacked structure (11, 10, 12) of the n-type GaN layer 12 further encompasses a δ-doped layer (delta-doped layer) 10. The δ-doped layer 10 is grown on a GaN substrate 11 having a surface, an orientation of which is satisfying the relationship of Equations (1) and (2) in terms of off angles $\Delta\theta_{1\text{-}100}$ and $\Delta\theta_{11\text{-}20}$. And an n-type GaN layer 12 is grown on the GaN substrate 11 through the δ-doped layer 10. Other structure and materials such as the device-structure portion of a laser diode, which is implemented by a stacked structure with the n-type cladding layer 13, the n-type GaN light-guiding layer 14, the active layer (light-emitting layer) 15, the first p-type GaN light-guiding layer 16, the overflow preventing layer 17, the second p-type GaN light-guiding layer 18, the p-type cladding layer 19, and the p-type GaN contact layer 20 in order, the stacked structure is formed on the n-type GaN layer 12, the structures of the ridge structure, an electrode and the like are similar to the structure and materials already explained in the first embodiment, with reference to FIG. 1, and overlapping or redundant description may be omitted in the modification of the first embodiment.

The δ-doped layer 10 is a GaN layer approximately 200 nm thick or less doped with n-type impurity atoms such as Si atoms with a concentration of at least about $5\times10^{17}$ cm$^{-3}$ and no greater than about $2\times10^{19}$ cm$^{-3}$, preferably at least about $1\times10^{18}$ cm$^{-3}$ and no greater than about $2\times10^{19}$ cm$^{-3}$, even more preferably at least about $4\times10^{18}$ cm$^{-3}$ and no greater than about $2\times10^{19}$ cm$^{-3}$. The thickness lower limit of the δ-doped layer 10 is equivalent to an atomic layer thickness or approximately 0.3 nm. The thickness of the δ-doped layer 10 should preferably fall within the range of an atomic layer thickness and about 150 nm, more preferably between about 5 nm and about 150 nm. When the impurity concentration of the δ-doped layer 10 exceeds about $2\times10^{19}$ cm$^{-3}$, the top surface of the n-type GaN layer 12 grown on the δ-doped layer 10 becomes rough.

In other words, when the δ-doped layer 10 doped with at least about $4\times10^{18}$ cm$^{-3}$ and no greater than about $2\times10^{19}$ cm$^{-3}$ of n-type impurity atoms such as Si atoms is formed to have a thickness ranging between an atomic layer thickness and about 200 nm as a favorable form, the lateral crystal growth speed inward the substrate surface can be accelerated, improving flatness of the top surface of the epitaxially grown layer. However, the effects of the lateral crystal growth are not prominent when the impurity concentration falls below about $4\times10^{18}$ cm$^{-3}$. The effectiveness further decreases as the impurity concentration falls below about $1\times10^{18}$ cm$^{-3}$, and when the impurity concentration falls below about $5\times10^{17}$ cm$^{-3}$, acceleration of the lateral crystal growth speed and improvement in surface flatness are more difficult to achieve.

As such, according to the semiconductor device (laser diode) associated with the modification of the first embodiment, the δ-doped layer 10 is provided between the n-type GaN layer 12 and the n-type GaN substrate 11, thereby accelerating the lateral crystal growth speed along inward the n-type GaN substrate 11 surface. The acceleration of the lateral crystal growth facilitates improved flatness in the surface morphology of the resulting grown wafer compared to the semiconductor device without having the δ-doped layer 10 according to the first embodiment shown in FIG. 1. As a result, the average threshold current of the semiconductor device (laser diode) according to the modification of the first embodiment, as shown in FIG. 2, is reduced to 45 milliamperes, the operating life is extended, and reliability is further improved.

Figure 12:
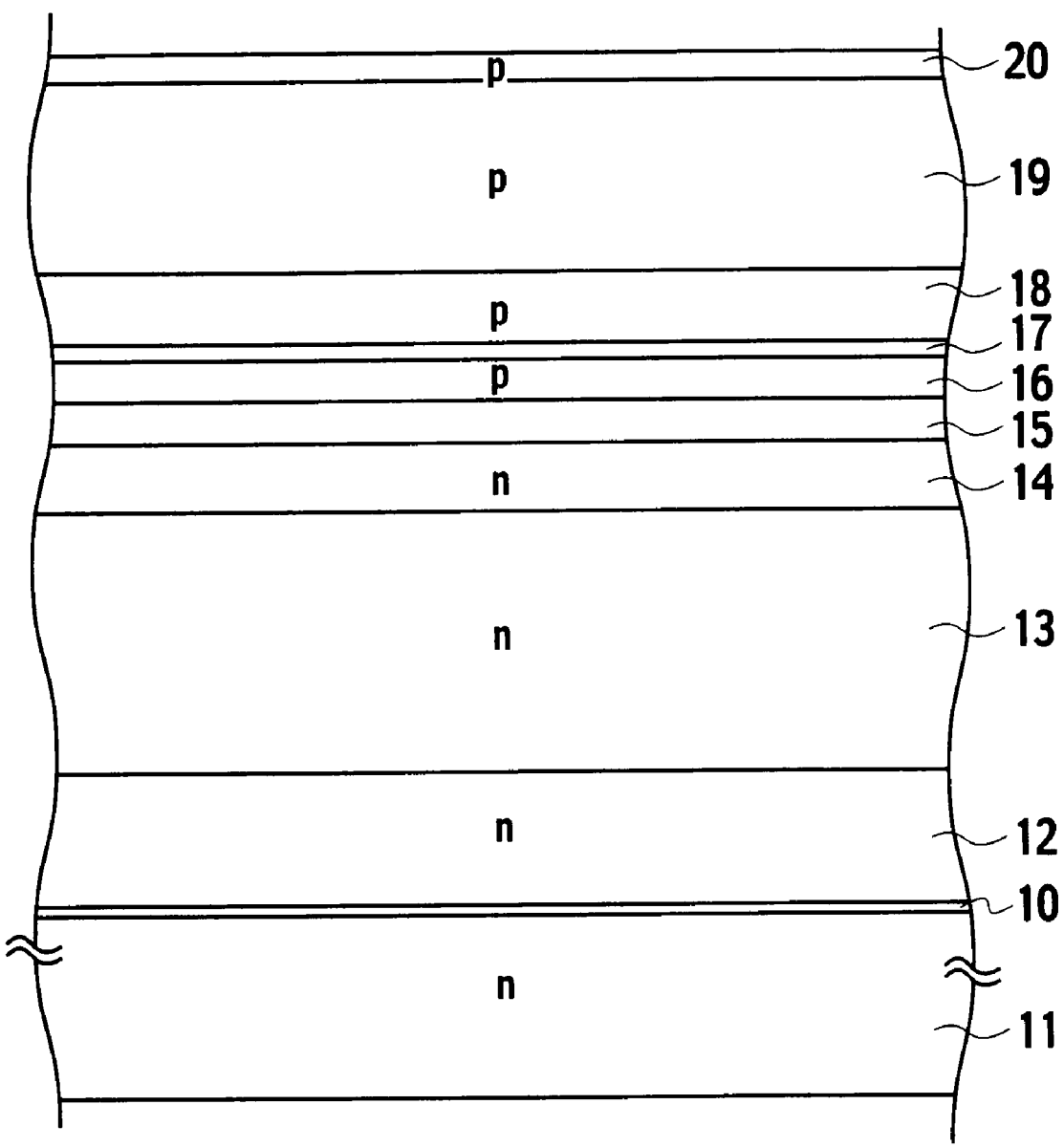
FIG. 12 is a process flow cross sectional view showing an intermediate product of the semiconductor device according to the modification of the first embodiment, in which a plurality of epitaxial layers are successively grown on a specific semiconductor substrate (epitaxial substrate), explaining the manufacturing method of the semiconductor device according to the modification of the first embodiment.

By the semiconductor device (laser diode) fabrication method, according to the modification of the first embodiment, as shown in FIG. 12, when the n-type GaN layer 12 is deposited via the δ-doped layer 10, on the GaN substrate 11 that has a surface orientation satisfying the relationship of Equations (1) and (2) in terms of off angles $\Delta\theta_{1\text{-}100}$ and $\Delta\theta_{11\text{-}20}$, and the n-type cladding layer 13, the n-type GaN light-guiding layer 14, the active layer (light-emitting layer) 15, the first p-type GaN light-guiding layer 16, the overflow preventing layer 17, the second p-type GaN light-guiding layer 18, the p-type cladding layer 19, and the p-type GaN contact layer 20 are then epitaxially grown successively, the steps thereafter are substantially the same as the procedures shown in FIGS. 7 through 10, and repetitive descriptions thereof are omitted.

SECOND EMBODIMENT

Figure 13:
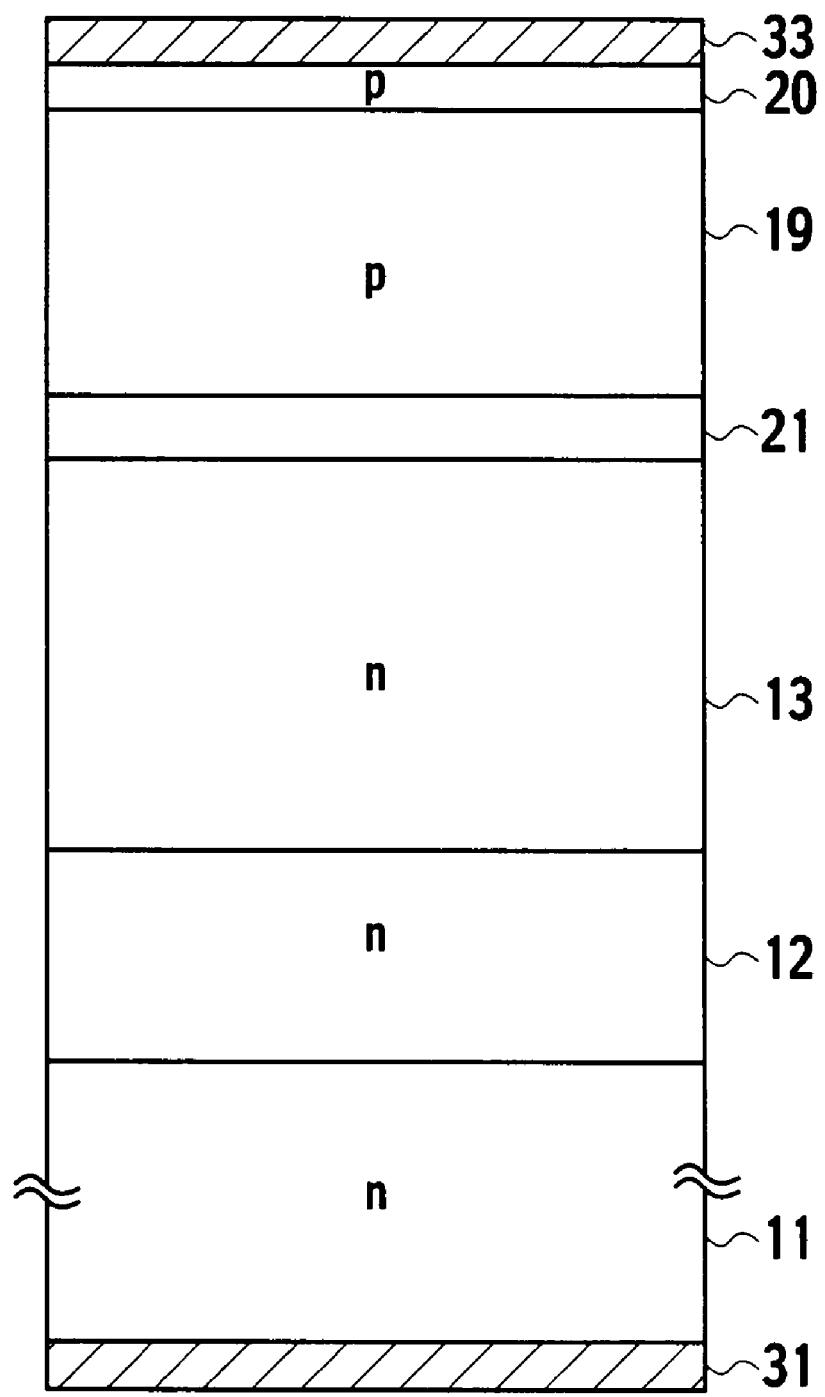
FIG. 13 is a schematic diagram showing a cross-sectional structure of a semiconductor device (LED), according to a second embodiment of the present invention.

A semiconductor device, according to the second embodiment of the present invention, as shown in FIG. 13, is the same as the semiconductor device already explained in the first embodiment in that the semiconductor device is formed on a first stacked structure (11, 12), which is implemented by a method such that growing an n-type GaN layer 12 on a GaN substrate 11, the GaN substrate 11 satisfies the relationship of Equations (1) and (2) in terms of off angles $\Delta\theta_{1\text{-}100}$ and $\Delta\theta_{11\text{-}20}$.

However, in the semiconductor device according to the second embodiment, a device-structure portion implementing a light-emitting diode (LED) is formed upon the first stacked structure (11, 12). As described with the first embodiment, the n-type GaN layer 12 is merely an example. More generally, it may naturally be an n-type single-crystal layer of another III-V nitride compound semiconductor such as an $In_xGa_{1-x-y}Al_yN$ layer.

In other words, as shown in FIG. 13, an n-type cladding layer 13 made of a Si-doped $Al_{0.05}Ga_{0.95}N$ layer is epitaxially grown directly on the n-type GaN layer 12 or the top layer of the first stacked structure (11, 12), and an active layer (light-emitting layer) 21 made of an $In_xGa_{1-x}N$ layer, a p-type cladding layer 19 made of a Mg-doped $Al_{0.05}Ga_{0.95}N$ layer, and a p-type GaN contact layer 20 made of a Mg-doped GaN layer are successively stacked in order upon the n-type cladding layer 13. Furthermore, on the p-type GaN contact layer 2, a transparent electrode implementing a p-side electrode (anode electrode) 33 is formed.

Details of device-structure portions such as the n-type cladding layer 13, the $In_xGa_{1-x}N$ active layer 21, the p-type cladding layer 19, and the p-type GaN contact layer 20 of the light-emitting diode (LED) are basically the same as those described for the semiconductor device already explained in the first embodiment, and repetitive description thereof is omitted. Furthermore, in the semiconductor device according to the second embodiment, a "device-structure portion" means a principal structure that bears the main operations of the LED, which is implemented by the second stacked structure (13, 21, 19, 20) shown in FIG. 13 as a base structure, and does not include the first stacked structure (11, 12) that serves as an n-type contact layer under the device-structure portion. In other words, the "device-structure portion" does not necessarily mean the entire device structure of an optical semiconductor as long as the device-structure portion includes a principal structure that bears the main operations of the semiconductor optical device, which is the same as those of the semiconductor device already explained in the first embodiment.

As described with the first embodiment, the n-type cladding layer 13, the $In_xGa_{1-x}N$ active layer 21, the p-type cladding layer 19, and the p-type GaN contact layer 20 forming the device-structure portion are merely an example, and the present invention is not limited to these materials. In other words, more generally, a single-crystal layer of another III-V nitride compound semiconductor such as an $In_xGa_{1-x-y}Al_yN$ layer is available for each layer forming the device-structure portion.

Since the semiconductor substrate (epitaxial substrate) according to the second embodiment has the GaN substrate 11, there are essentially few problems of defects such as threading dislocation and cracks ascribable to the lattice mismatch between the epitaxially grown layer and the GaN substrate 11. Also, since the orientation of crystal plane of the GaN substrate 11 is optimized, an epitaxially grown layer of a III-V nitride compound semiconductor with favorable surface morphology and surface flatness is obtained. Furthermore, the semiconductor device (LED) according to the second embodiment uses a semiconductor substrate having excellent surface flatness, and therefore characteristic improvements such as use of a low operating voltage, high brightness, high luminous efficiency and the like may be achieved.

Although omitted from the drawing, even with the semiconductor device (LED), according to the second embodiment of the present invention, as shown in FIG. 11, growing the n-type GaN layer 12 on the n-type GaN substrate 11 via a δ-doped layer 10 is preferred. As described with the first embodiment, the δ-doped layer 10 is a GaN layer less than about 200 nm thick doped with n-type impurity atoms with a concentration of at least about $5 \times 10^{17}$ cm$^{-3}$ and no greater than about $2 \times 10^{19}$ cm$^{-1}$, preferably at least about $1 \times 10^{18}$ cm$^{-3}$ and no greater than about $2 \times 10^{19}$ cm$^{-1}$, even more preferably at least about $4 \times 10^{18}$ cm$^{-3}$ and no greater than about $2 \times 10^{19}$ cm$^{-3}$. The thickness of the δ-doped layer 10 should preferably fall within the range of an atomic layer thickness and about 150 nm, more preferably between about 5 nm and about 150 nm. When the impurity concentration of the δ-doped layer 10 exceeds about $2 \times 10^{19}$ cm$^{-3}$, the top surface of the n-type GaN layer 12 grown thereupon becomes rough, and is therefore unfavorable. When the layer doped with at least about $4 \times 10^{18}$ cm$^{-3}$ and no greater than about $2 \times 10^{19}$ cm$^{-3}$ of n-type impurity atoms is formed to have a thickness ranging between an atomic layer thickness and about 200 nm, the lateral crystal growth speed along inward the substrate surface may be accelerated, improving flatness of the top surface of the epitaxially grown layer. Effects of the acceleration of the lateral crystal growth speed are not prominent when the impurity concentration falls below about $4 \times 10^{18}$ cm$^{-3}$. Effects of the acceleration of the lateral crystal growth speed further decreases when the impurity concentration falls below about $1 \times 10^{18}$ cm$^{-3}$, and when the impurity concentration falls below about $5 \times 10^{18}$ cm$^{-3}$, the effects of the acceleration of the lateral crystal growth speed and improvement in surface flatness are almost impossible to achieve. Inserting the δ-doped layer 10 between the n-type GaN layer 12 and the n-type GaN substrate 11 facilitates further improvement in surface morphology and surface flatness, providing further characteristic improvement such as the operation at a low operating voltage, high brightness, high luminous efficiency and the like of the semiconductor device (LED) according to the second embodiment.

[Device Fabrication]

A semiconductor device fabrication method, according to the second embodiment of the present invention, is basically the same as the semiconductor device fabrication method already explained in the first embodiment shown in FIGS. 5A-5C, 6, 7, 8, 9 and 10, but is simplified.

Figure 14:
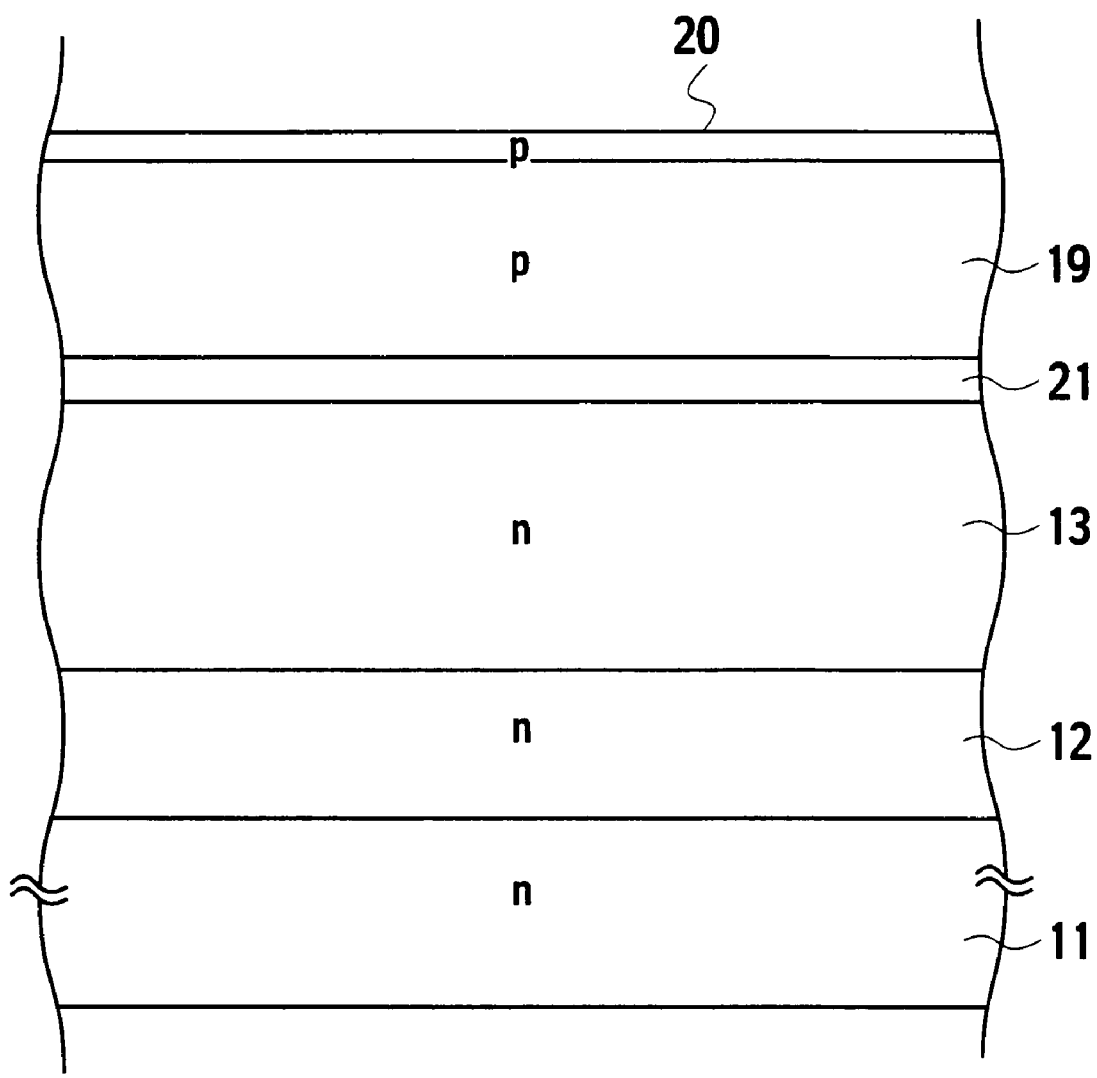
FIG. 14 is a process flow cross sectional view showing an intermediate product of the semiconductor device according to the second embodiment, in which a plurality of epitaxial layers are successively grown on a specific semiconductor substrate (epitaxial substrate), explaining the manufacturing method of the semiconductor device according to the second embodiment.

(a) First, as shown in FIG. 14, an n-type cladding layer 13 made of a Si-doped $Al_{0.05}Ga_{0.95}N$ layer is epitaxially grown directly on the n-type GaN layer 12 or the top layer of the first stacked structure (11, 12), the first stacked structure (11, 12) serving as a semiconductor substrate or the epitaxial substrate. Then, an $In_xGa_{1-x}N$ active layer (light-emitting layer) 21, a p-type cladding layer 19, and a p-type GaN contact layer 20 are epitaxially grown successively in order upon the n-type cladding layer 13.

(b) Furthermore, a p-side electrode (anode electrode) 33 made up of a transparent electrode such as a tin (Sn)-doped indium oxide ($In_2O_3$) film (ITO), an indium (In)-doped zinc oxide (ZnO) film (IZO), a gallium (Ga)-doped zinc oxide film (GZO), a tin oxide ($SnO_2$) film and the like is formed upon the p-type GaN contact layer 20. Alternatively, the transparent electrode may be a metallic thin film of gold (Au), nickel (Ni) or the like, which is thinly deposited so as to preserve the optical transparency.

(c) Subsequently, as shown in FIG. 13, a Ti/Pt/Au composite film is deposited on the bottom surface of the n-type GaN substrate 11 through vacuum evaporation or sputtering. For example, about 0.05-micrometer-thick Ti film, about 0.05-micrometer-thick Pt film, and about one-micrometer-thick Au film are successively deposited. Then, heat treatment (sintering) is carried out so as to decrease the contact resistance of an n-side electrode (cathode electrode) 31. A desired size is provided by cleaving, or by using a cutting means such a diamond blade, completing the semiconductor device (light-emitting diode (LED)) shown in FIG. 13.

As described above, since the GaN substrate 11 is used according to the semiconductor device fabrication method, according to the second embodiment of the present invention, there are essentially few problems of defects such as threading dislocation and cracks, which are ascribable to the lattice mismatch between the epitaxially grown layer and the GaN substrate 11. Also, since the orientation of crystal plane of the GaN substrate 11 is optimized, surface morphology and surface flatness are favorable. Accordingly, a high crystallographic quality III-V nitride compound semiconductor epitaxial layer is grown uniformly on the n-type GaN substrate 11. Therefore, a high-performance III-V nitride compound semiconductor device is provided with excellent yield and at low cost.

Third Embodiment

Figure 15:
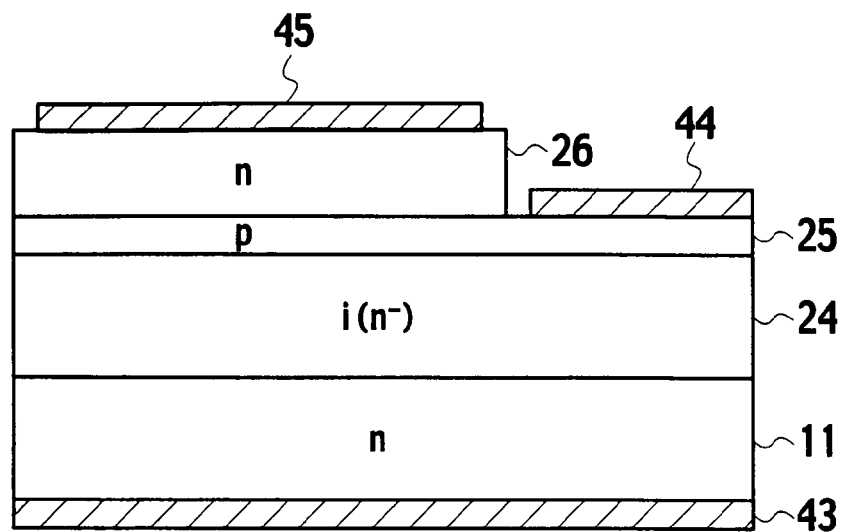
FIG. 15 is a schematic diagram showing a cross-sectional structure of a semiconductor device (HBT), according to a third embodiment of the present invention.

A semiconductor device, according to the third embodiment of the present invention, as shown in FIG. 15, implements a hetero-junction bipolar transistor (HBT) by a device-structure portion (26, 25, 24), the device-structure portion (26, 25, 24) is formed by successively stacking an n-type drift layer 24 made of a Si-doped GaN layer, a p-type base layer 25 made of a Mg-doped $In_xGa_{1-x}N$ layer, and an n-type emitter layer 26 made of a Si-doped layer on a GaN substrate 11, the GaN substrate 11 satisfies the relationship of Equations (1) and (2) in terms of off angles $\Delta\theta_{1-100}$ and $\Delta\theta_{11-20}$. The n-type GaN substrate 11 serves as a collector layer (collector contact layer).

The n-type drift layer 24 is a single-crystal layer of a III-V nitride compound semiconductor about 0.3 to 1.5 micrometer thick and doped with Si atoms with a concentration of about $1\times10^{14}$ to $5\times10^{16}$ cm$^{-3}$. While the Mg concentration and thickness of the p-type base layer 25 may be determined with consideration of operating frequency and the breakdown voltage of the HBT, the Mg concentration should be selected to fall between about $5\times10^{18}$ to $7\times10^{19}$ cm$^{-3}$, and the thickness to fall between about five to 80 nm. The n-type emitter layer 26 is a single-crystal layer of a III-V nitride compound semiconductor having about 0.2 to 0.5 micrometer thickness and doped with Si with a concentration of about $3\times10^{18}$ to $6\times10^{18}$ cm$^{-3}$. As shown in FIG. 15, an emitter electrode 45 made of a titanium-platinum-gold (Ti/Pt/Au) composite film is provided on the n-type emitter layer 26. For example, the emitter electrode 45 may be formed of about 0.04-micrometer-thick Ti film, about 0.04-micrometer-thick Pt film, and about 0.5-micrometer-thick Au film. Furthermore, a base electrode-extracting groove is formed passing through the n-type emitter layer 26 and exposing a part of the top surface of the p-type base layer 25. A base electrode 44 makes ohmic contact with the p-type base layer 25 at the bottom of the base electrode-extracting groove. For example, the base electrode 44 is made of palladium-platinum-gold (Pd/Pt/Au) composite film, where about 0.05-micrometer-thick Pd film, about 0.05-micrometer-thick Pt film, and about 0.2-micrometer-thick Au film may be used.

A collector electrode 43 made of a titanium-platinum-gold (Ti/Pt/Au) composite film is deposited on the bottom surface of the n-type GaN substrate 11. The collector electrode 43, as with the emitter electrode 45, may be formed of a combination of about 0.04-micrometer-thick Ti film, about 0.04-micrometer-thick Pt film, and about 0.5-micrometer-thick Au film.

As such, since the semiconductor substrate (epitaxial substrate) according to the third embodiment has the GaN substrate 11, there are essentially few problems of defects such as threading dislocation and cracks associated with the lattice mismatch between the epitaxially grown layer and the GaN substrate 11. Also, since the orientation of crystal plane of the GaN substrate 11 is optimized, epitaxially grown layers of a III-V nitride compound semiconductor with favorable surface morphology and surface flatness may be provided.

Furthermore, because the semiconductor device (HBT) according to the third embodiment is implemented by the semiconductor substrate (epitaxial substrate) with excellent surface flatness, the current gain β is increased, the high-frequency characteristics is improved, and current cut-off frequency $f_T$ is improved.

Note that as described with the first and second embodiments, respective materials of the n-type drift layer 24, the p-type base layer 25, and the n-type emitter layer 26 are merely examples. More generally, a single-crystal layer of another III-V nitride compound semiconductor such as an In$_x$Ga$_{1-x-y}$Al$_y$N layer may be selected, so as to satisfy a forbidden bandgap relationship required for the HBT. In other words, if the bandgap of the n-type emitter layer 26 is selected to satisfy conditions for a wider "wide bandgap emitter" than the bandgap of the p-type base layer 25, single-crystal layers of various III-V nitride compound semiconductors may be selected for the respective layers 24, 25, and 26. For example, an n-type drift layer 24 made of a GaN layer, a p-type base layer 25 made of a GaN layer, and an n-type emitter layer 26 made of an Al$_y$Ga$_{1-y}$N layer may be provided upon the n-type GaN substrate 11.

Note that in the semiconductor device according to the third embodiment of the present invention, a "device-structure portion" means the n-type drift layer 24, the p-type base layer 25, and the n-type emitter layer 26, and does not include the n-type GaN substrate 11 that serves as a collector layer (collector contact layer). In other words, the "device-structure portion" of the semiconductor device, according to the third embodiment, does not necessarily mean the entire device structure of the semiconductor device as long as it includes a principal structure that bears the main operations of the semiconductor electronic device, which is the same as described with the semiconductor devices according to the first and second embodiments.

Although omitted from the drawing, even with the semiconductor device (HBT), according to the third embodiment of the present invention, as shown in FIG. 11, depositing the n-type drift layer 24 on the n-type GaN substrate 11 via a δ-doped layer 10 is preferred. As described with the first embodiment, the δ-doped layer 10 is a GaN layer less than about 200 nm thick doped with n-type impurity atoms with a concentration of at least about $5\times10^{17}$ cm$^{-3}$ and no greater than about $2\times10^{19}$ cm$^{-3}$, preferably at least about $1\times10^{18}$ cm$^{-3}$ and no greater than about $2\times10^{19}$ cm$^{-3}$, even more preferably at least about $4\times10^{18}$ cm$^{-3}$ and no greater than about $2\times10^{19}$ cm$^{-3}$. The thickness of the δ-doped layer 10 should preferably fall within the range of an atomic layer thickness and about 150 nm, more preferably between about five nm and 150 nm. Use of the δ-doped layer 10 allows further favorable surface morphology and surface flatness, and therefore current gain β of the semiconductor device (HBT) according to the third embodiment is further increased and high-frequency characteristics are also further improved.

[Device Fabrication]

A fabrication method for the semiconductor device, according to the third embodiment of the present invention, is basically the same as the semiconductor device fabrication methods according to the first and second embodiments.

Figure 16:
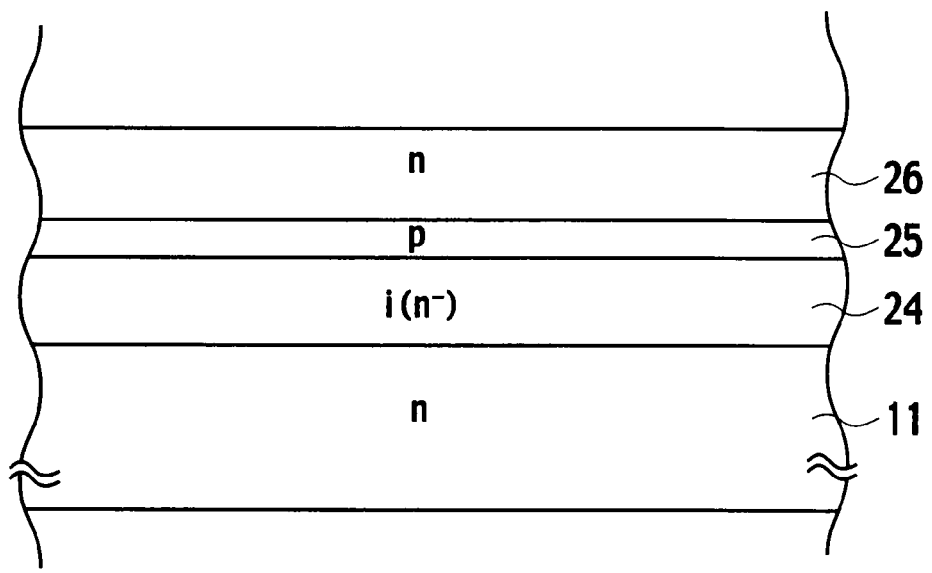
FIG. 16 is a process flow cross sectional view showing an intermediate product of the semiconductor device according to the third embodiment, in which a plurality of epitaxial layers are successively grown on a GaN substrate, explaining the manufacturing method of the semiconductor device according to the third embodiment.

(a) First, an n-type GaN substrate 11 is inserted in a MOCVD furnace, and as described with the fabrication method for the semiconductor device according to the second embodiment, an n-type drift layer 24 made of a Si-doped GaN layer, a p-type base layer 25 made of a Mg-doped In$_{0.1}$Ga$_{0.9}$N layer, and an n-type emitter layer 26 made of a Si-doped GaN layer are epitaxially grown successively in order on the n-type GaN substrate 11 as shown in FIG. 16. The stacked structure (11, 24) encompassing the n-type GaN substrate 11 and the n-type drift layer 24 grown on the n-type GaN substrate 11 may correspond to the semiconductor substrate (11, 12) of the first and second embodiments. However, the entire stacked structure (11, 24, 25, 26) made of the n-type GaN substrate 11, the n-type drift layer 24, the p-type base layer 25, and the n-type emitter layer 26 may be called as a "semiconductor substrate (epitaxial substrate)". The successive epitaxial growth is basically the same as the semiconductor device fabrication method according to the second embodiment described with reference to FIG. 14, and repetitive description thereof is omitted.

(b) Subsequently, a pattern for a photoresist film for base electrode-extracting groove formation is delineated on the top surface of the n-type emitter layer 26 through photolithography, and using the photoresist film pattern as an etching mask, a base electrode-extracting groove, which passes through the n-type emitter layer 26 and exposes a part of the top surface of the p-type base layer 25, is formed through etching such as RIE.

(c) An emitter electrode 45 made of a titanium-platinum-gold (Ti/Pt/Au) composite film is deposited on the n-type emitter layer 26, and a pattern for a collector electrode 43 made of a titanium-platinum-gold (Ti/Pt/Au) composite film is delineated on the bottom surface of the n-type GaN substrate 11. Then, after heat treatment (sintering), contact resistances of both the emitter electrode 45 and the collector electrode 43 decrease.

(d) Further, as shown in FIG. 15, a base electrode 44 made of a Pd/Pt/Au composite film is delineated on the p-type base layer 25 using a lift-off method. In other words, after formation of a photoresist film having a window corresponding to a pattern for the p-side electrode (anode electrode) 44, about 0.04-micrometer-thick Ti film, about 0.04-micrometer-thick Pt film, and about 0.5-micrometer-thick Au film are successively deposited through vacuum evaporation or sputtering, and the photoresist film is then stripped so as to leave a pattern of the base electrode 44 at the position of the window.

As described above, since the GaN substrate 11 is used according to the semiconductor device fabrication method according to the third embodiment of the present invention, there are essentially few problems of defects such as threading dislocation and cracks associated with lattice mismatch between the epitaxially grown layer and the GaN substrate 11. Also, since the orientation of crystal plane of the GaN substrate 11 is optimized, surface morphology and surface flatness are favorable. Accordingly, a high crystallographic quality III-V nitride compound semiconductor epitaxial layer is grown uniformly on the n-type GaN substrate 11. Therefore, a high-performance III-V nitride compound semiconductor device is provided with excellent yield and at low cost.

Other Embodiments

Various modifications will become possible for those skilled in the art after receiving the teaching of the present disclosure without departing from the scope thereof. For example, the present invention is not limited to a laser diode, an LED, or an HBT as described with the first, second and third embodiments, and is alternatively applicable to various semiconductor devices including various semiconductor electronic devices such as a high electron mobility transistor (HEMT), a junction field effect transistor (FET), a Schottky gate FET (MESFET), or a static induction transistor (SIT), or a semiconductor optical device such as a semiconductor photodetector.

Figure 17:
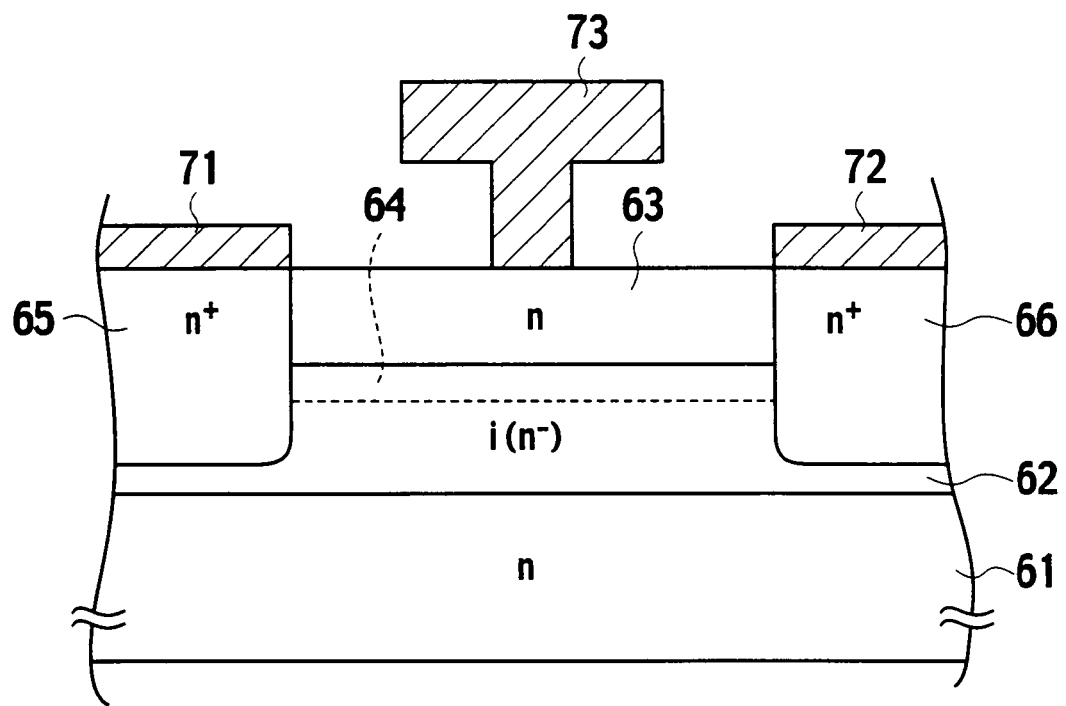
FIG. 17 is a schematic diagram showing a cross-sectional structure of a semiconductor device (HEMT), according to another embodiment of the present invention.

As an example of such semiconductor electronic devices, FIG. 17 shows a schematic configuration of a HEMT, implemented by a device-structure portion (62, 63, 64, 65, 66). The device-structure portion (62, 63, 64, 65, 66) is formed by successively stacking an unintentionally doped GaN layer (first single-crystal layer) 62, and an unintentionally doped $Al_xGa_{1-x}N$ layer (second single-crystal layer) 63 on a GaN substrate 61, the GaN substrate 61 is a high resistivity substrate or a semi-insulating substrate which satisfies the relationship of Equations (1) and (2) in terms of off angles $\Delta\theta_{1-100}$ and $\Delta\theta_{11-20}$. The unintentionally doped GaN layer 62 is a single-crystal layer having a thickness of about 0.8 to 4.5 micrometer and being not intentionally doped with impurity atoms. The unintentionally doped $Al_xGa_{1-x}N$ layer 63 is a single-crystal layer having a thickness of about 60 to 150 nanometers and being not intentionally doped with impurity atoms. A two-dimensional electron gas 64 is formed at the top surface of and in the unintentionally doped GaN layer 62 due to the greater electron affinity of the doped GaN layer 62. An n-type source region 65 and n n-type drain region 66 are formed penetrating the unintentionally doped $Al_xGa_{1-x}N$ layer 63 into the unintentionally doped GaN layer 62. The source region 65 and the drain region 66 are heavily doped with n-type impurity atoms such as Si atoms with a concentration of at least about $1\times10^{17}$ cm$^{-3}$ and no greater than about $1\times10^{19}$ cm$^{-3}$, for example. As shown in FIG. 17, a source electrode 71 and a drain electrode 72 made of titanium-aluminum (Ti/Al) composite films are formed on the n-type source region 65 and the n-type drain region 66, respectively. A T-shaped gate electrode 73 made of platinum-gold (Pt/Au) composite films is formed so as to implement a Schottky barrier gate on the unintentionally doped $Al_xGa_{1-x}N$ layer 63 between the n-type source region 65 and the n-type drain region 66. The unintentionally doped $Al_1Ga_{1-x}N$ layer 63 is fully depleted of mobile charge near the heterojunction interface and act as if the gate oxide of a MOSFET. By the presence of the Pt/Au Schottky barrier gate 73, a depletion layer is formed beneath the Pt/Au Schottky barrier gate 73. Application of negative bias to the Schottky barrier gate 73 will extend the gate depletion region to the heterojunction interface raising the barrier to electron flow and thereby pinching off the drain-source current (main current).

With such configuration, since the semiconductor substrate (63, 62, 61) according to the other embodiment has the GaN substrate 61, there are essentially few problems of defects such as threading dislocation and cracks associated with the lattice mismatch between the epitaxially grown layers 62, 63 and the GaN substrate 61. Also, since the orientation of crystal plane of the GaN substrate 61 is optimized, epitaxially grown unintentionally doped GaN layer 62 and unintentionally doped $Al_xGa_{1-x}N$ layer 63 with favorable surface morphology and surface flatness are provided. Furthermore, because the HEMT according to the other embodiment is implemented by the semiconductor substrate (63, 62, 61) with excellent surface flatness, the transconductance $g_m$ is increased, the high-frequency characteristic is improved, and current cut-off frequency $f_T$ is improved.

Note that as described with the first to third embodiments, respective materials of the first single-crystal layer (unintentionally doped GaN layer) 62, the second single-crystal layer (unintentionally doped $Al_xGa_{1-x}N$ layer) 63 are merely examples. For example, a composite film made of an AlN film with a thickness of 6 nanometers and a GaN film with a thickness of 100-250 nanometers may be employed instead of the $Al_xGa_{1-x}N$ layer 63. More generally, first and second single-crystal layers of another III-V nitride compound semiconductor such as an $In_xGa_{1-x-y}Al_yN$ layer may be selected in view of the forbidden bandgap relationship, so as to implement a heterojunction between first and second single-crystal layers, which is required for the HEMT.

Note that in the semiconductor device according to the other embodiment of the present invention, a "device-structure portion" means the unintentionally doped GaN layer (first single-crystal layer) 62, the unintentionally doped $Al_xGa_{1-x}N$ layer (second single-crystal layer) 63, the n-type source region 65 and the drain region 66, and does not include the n-type GaN substrate 61. In other words, the "device-structure portion" of the semiconductor device, according to the other embodiment, does not necessarily mean the entire device structure of the semiconductor device as long as it includes a principal structure that bears the main operations of the semiconductor electronic device, which is the same as described with the semiconductor devices according to the first to third embodiments. Although omitted from the drawing, even with the HEMT, according to the other embodiment of the present invention, as shown in FIG. 11, depositing the unintentionally doped GaN layer 62 on the n-type GaN substrate 61 via a δ-doped layer 10 is preferred.

Figure 18:
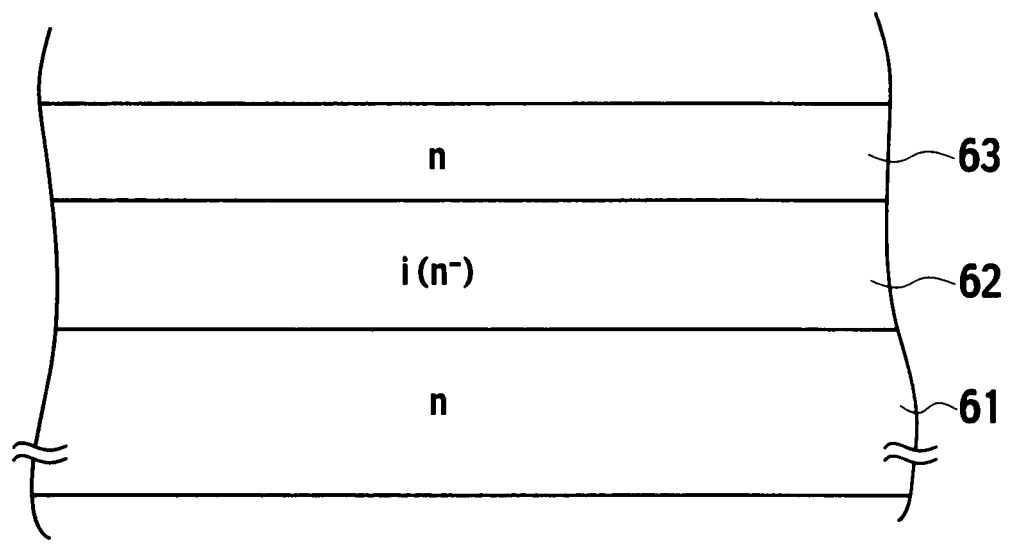
FIG. 18 is a process flow cross sectional view showing an intermediate product of the semiconductor device according to the another embodiment, in which a plurality of epitaxial layers are successively grown on a GaN substrate, explaining the manufacturing method of the semiconductor device according to the another embodiment.

A fabrication method for the HEMT, according to the other embodiment of the present invention, is basically the same as the fabrication methods already explained in the first to third embodiments. That is, firstly, an n-type GaN substrate 61 is inserted in a MOCVD furnace, and an unintentionally doped GaN layer (first single-crystal layer) 62 and a unintentionally doped $Al_xGa_{1-x}N$ layer (second single-crystal layer) 63 are epitaxially grown successively in order on the n-type GaN substrate 61, as shown in FIG. 18. The stacked structure (61, 62) encompassing the n-type GaN substrate 61 and the unintentionally doped GaN layer 62 grown on the n-type GaN substrate 61 may correspond to the semiconductor substrate (11, 12) of the first to third embodiments. However, the entire stacked structure (61, 62, 63) made of the n-type GaN substrate 61, the unintentionally doped GaN layer 62, may be called as a "semiconductor substrate". The successive epitaxial growth is basically the same as the fabrication method according to the first to third embodiments, and repetitive description thereof is omitted. Subsequently, n-type impurity ions such as Si ions are selectively implanted using a pattern of photoresist film as implantation mask. After removing the implantation mask, the stacked structure (61, 62, 63) is annealed so as to form the n-type source region 65 and the drain region 66. Then, a source electrode 71 and a drain electrode 72 made of titanium-aluminum (Ti/Al) composite films are selectively deposited on the n-type source region 65 and the drain region 66, using a lift-off method. Then, after heat treatment (sintering), contact resistances of both the source electrode 71 and the drain electrode 72 decrease. Next, a T-shaped gate electrode 73 made of platinum-gold (Pt/Au) composite films is formed on the unintentionally doped $Al_xGa_{1-x}N$ layer 63 between the n-type source region 65 and the n-type drain region 66 using the lift-off method, as shown in FIG. 17.

Furthermore, the semiconductor electronic device is not limited to the simple configurations shown in FIGS. 15 and 17, but a plurality of unit devices might be arranged in the form of an interdigitated, grid or meandering gate geometry, or alternatively a multi-channel geometry as is commonly known in the power semiconductor device so as to achieve a high current capability.

Furthermore, the semiconductor electronic device is not only applicable to discrete devices, but also to an integrated circuit. For example, using HBT described with the third embodiment, various logic circuits such as an integrated injection logic (IIL) circuit or various memories may be integrated on a single n-type GaN substrate 11, as long as the n-type GaN substrate 11 satisfies the relationship of Equations (1) and (2) in terms of off angles $\Delta\theta_{1-100}$ and $\Delta\theta_{11-20}$.

Thus, the present invention of course includes various embodiments and modifications and the like which are not detailed above. Therefore, the scope of the present invention will be defined in the following claims.

What is claimed is:

1. A method for growing a semiconductor substrate, comprising:
    preparing a GaN substrate having a surface bidirectionally inclined from a {0001} crystal plane by two specified off-angles with respect to two crystal axis directions, respectively, such that an orientation of the surface is defined by a first absolute value of a first off-angle of the surface from the {0001} crystal plane towards <1-100> direction, the first absolute value is equal to or larger than 0.12 degree and equal to or smaller than 0.35 degree and by a second absolute value of a second off-angle of the surface from the {0001} crystal plane towards <11-20> direction, the second absolute value is larger than 0.00 degree and equal to or smaller than 0.06 degree; and
    epitaxially growing a single-crystal layer of III-V nitride compound semiconductor on the surface of the GaN substrate.

2. The method of claim 1, further comprising:
    epitaxially growing a doped layer between the single-crystal layer and the GaN substrate so that the doped layer is doped with impurity atoms to a concentration of at least about $5\times10^{17}$ cm$^{-3}$ and no greater than about $2\times10^{19}$ cm$^{-3}$.

3. The method of claim 2, wherein the doped layer has a thickness of at least about 0.3 nm and no greater than about 200 nm.

4. The method of claim 2, wherein the GaN substrate is an n-type GaN substrate, and the doped layer is doped with n-type impurity atoms as the impurity atoms.

5. The method of claim 1, wherein the first absolute value lies in a range of 0.12 degree to 0.30 degree.

6. The method of claim 5, wherein the first absolute value lies in a range of 0.14 degree to 0.28 degree.

7. A method for manufacturing a semiconductor light-emitting device, comprising:
    preparing a GaN substrate having a surface bidirectionally inclined from a {0001} crystal plane by two specified off-angles with respect to two crystal axis directions, respectively, such that an orientation of the surface is defined by a first absolute value of a first off-angle of the surface from the {0001} crystal plane towards <1-100> direction, the first absolute value is equal to or larger than 0.12 degree and equal to or smaller than 0.35 degree and by a second absolute value of a second off-angle of the surface from the {0001} crystal plane towards <11-20> direction, the second absolute value is larger than 0.00 degree and equal to or smaller than 0.06 degree;
    epitaxially growing a single-crystal layer of III-V nitride compound semiconductor on the surface of the GaN substrate; and
    epitaxially growing a light-emitting layer of III-V nitride compound semiconductor on the single-crystal layer.

8. The method of claim 7, wherein the GaN substrate is an n-type GaN substrate, and the single-crystal layer is an n-type III-V nitride compound semiconductor.

9. The method of claim 8, further comprising:
    epitaxially growing an n-type cladding layer of III-V nitride compound semiconductor between the single-crystal layer and the light-emitting layer; and
    epitaxially growing a p-type cladding layer of III-V nitride compound semiconductor on the light-emitting layer.

10. The method of claim 9, further comprising:
    epitaxially growing an n-type light-guiding layer of III-V nitride compound semiconductor between the n-type cladding layer and the light-emitting layer; and
    epitaxially growing a p-type light-guiding layer of III-V nitride compound semiconductor between the p-type cladding layer and the light-emitting layer.

11. The method of claim 7, further comprising:
    epitaxially growing a doped layer between the single-crystal layer and the GaN substrate so that the doped layer is doped with impurity atoms to a concentration of at least about $5\times10^{17}$ cm$^{-3}$ and no greater than about $2\times10$ cm$^{-3}$.

12. The method of claim 11, wherein the doped layer has a thickness of at least about 0.3 nm and no greater than about 200 nm.

13. The method of claim 11, wherein the GaN substrate is an n-type GaN substrate, and the doped layer is doped with n-type impurity atoms as the impurity atoms.

14. The method of claim 7, wherein the first absolute value lies in a range of 0.12 degree to 0.30 degree.

15. The method of claim 14, wherein the first absolute value lies in a range of 0.14 degree to 0.28 degree.

16. A method for manufacturing a semiconductor device, comprising:
    preparing a GaN substrate having a surface bidirectionally inclined from a {0001} crystal plane by two specified off-angles with respect to two crystal axis directions, respectively, such that an orientation of the surface is defined by a first absolute value of a first off-angle of the surface from the {0001} crystal plane towards <1-100> direction, the first absolute value is equal to or larger than 0.12 degree and equal to or smaller than 0.35 degree and by a second absolute value of a second off-angle of the surface from the {0001} crystal plane towards <11-20> direction, the second absolute value is larger than 0.00 degree and equal to or smaller than 0.06 degree; and
    epitaxially growing a device-structure portion formed of III-V nitride compound semiconductor on the GaN substrate.

17. The method of claim 16, wherein the device-structure portion comprises a light-emitting layer.

18. The method of claim 16, wherein the GaN substrate is an n-type GaN substrate, and the epitaxially growing the device-structure portion comprises:
    epitaxially growing an n-type drift layer of III-V nitride compound semiconductor on the n-type GaN substrate;
    epitaxially growing a p-type base layer of III-V nitride compound semiconductor on the n-type drift layer; and
    epitaxially growing an n-type emitter layer of III-V nitride compound semiconductor on the p-type base layer.

19. The method of claim 18, wherein the n-type emitter layer has wider bandgap than the p-type base layer.

20. The method of claim 16, wherein the epitaxially growing the device-structure portion comprises:
    epitaxially growing a first single-crystal layer of III-V nitride compound semiconductor on the GaN substrate; and
    epitaxially growing a second single-crystal layer of III-V nitride compound semiconductor on the first single-crystal layer, having wider bandgap than the first single-crystal layer.

21. The method of claim 16, further comprising:
    epitaxially growing a doped layer between the device-structure portion and the GaN substrate so that the doped layer is doped with impurity atoms to a concentration of at least about $5 \times 10^{17}$ cm$^{-3}$ and no greater than about $2 \times 10^{19}$ cm$^{-3}$.

22. The method of claim 21, wherein the doped layer has a thickness of at least about 0.3 nm and no greater than about 200 nm.

* * * * *